(12) United States Patent
Chung et al.

(10) Patent No.: US 10,177,326 B2
(45) Date of Patent: Jan. 8, 2019

(54) POLYMERIC DIELECTRICS, METHODS OF MANUFACTURING THE SAME, AND ELECTRONIC DEVICES AND THIN FILM TRANSISTORS INCLUDING THE SAME

(71) Applicants: Samsung Electronics Co., Ltd., Suwon-si, Gyeonggi-do (KR); The Board of Trustees of the Leland Stanford Jr. University, Stanford, CA (US)

(72) Inventors: Jong Won Chung, Hwaseong-si (KR); Sangyoon Lee, Seoul (KR); Ying-Li Rao, Stanford, CA (US); Zhenan Bao, Stanford, CA (US)

(73) Assignees: Samsung Electronics Co., Ltd., Gyeonggi-Do (KR); The Board of Trustees of the Leland Stanford Junior University, Stanford, CA (US)

( * ) Notice: Subject to any disclaimer, the term of this patent is extended or adjusted under 35 U.S.C. 154(b) by 0 days.

(21) Appl. No.: 15/499,099

(22) Filed: Apr. 27, 2017

(65) Prior Publication Data
US 2017/0331057 A1 Nov. 16, 2017

Related U.S. Application Data

(60) Provisional application No. 62/335,254, filed on May 12, 2016.

(51) Int. Cl.
*H01L 51/00* (2006.01)
*C08G 77/38* (2006.01)
*H01L 51/05* (2006.01)

(52) U.S. Cl.
CPC .......... *H01L 51/0094* (2013.01); *C08G 77/38* (2013.01); *H01L 51/0036* (2013.01);
(Continued)

(58) Field of Classification Search
CPC ............. H01L 51/0094; H01L 51/0036; H01L 51/0048; H01L 51/0043; H01L 51/0545; H01L 51/004; H01L 51/052; C08G 77/38
See application file for complete search history.

(56) References Cited

U.S. PATENT DOCUMENTS 5,413,727 A * 5/1995 Drapier .................... C11D 1/04
510/221
8,309,954 B2 11/2012 Ito
(Continued)

FOREIGN PATENT DOCUMENTS

JP 2012-111864 A 6/2012

OTHER PUBLICATIONS

Journal of American Chemical Society, (Stretchable Self-healing Polymeric Dielectrics Cross-Linked Through Metal-Ligand Coordination, Apr. 21, 2016, pp. 6020-6027, Rao et al.*
(Continued)

*Primary Examiner* — Victor A Mandala
(74) *Attorney, Agent, or Firm* — Harness, Dickey & Pierce, P.L.C.

(57) ABSTRACT

A polymeric dielectric may include a coordination complex of a modified elastic polymer and a metal cation. The modified elastic polymer may include an organic ligand moiety that coordinates the metal cation in a main chain of the elastic polymer. Provided are a method of manufacturing the same, and an electronic device and a thin film transistor including the same.

29 Claims, 31 Drawing Sheets

(52) U.S. Cl.
CPC ...... *H01L 51/0043* (2013.01); *H01L 51/0048* (2013.01); *H01L 51/004* (2013.01); *H01L 51/052* (2013.01); *H01L 51/0545* (2013.01)

(56) References Cited

U.S. PATENT DOCUMENTS

| | | |
|---|---|---|
| 8,395,146 B2 | 3/2013 | Hahn et al. |
| 9,834,687 B2 * | 12/2017 | Thevasahayam ........ C08K 3/28 |
| 2009/0311210 A1 * | 12/2009 | Hu ....................... A61K 8/8147 424/70.11 |
| 2010/0233112 A1 * | 9/2010 | Hu .......................... A61K 8/87 424/70.11 |
| 2016/0035457 A1 | 2/2016 | Murase et al. |
| 2018/0079887 A1 * | 3/2018 | Chino ................... C08F 210/02 |

OTHER PUBLICATIONS

J. R. Soc. Interface 2007, 4, 359.
Nature 2011, 472, 334.
Natl. Acad. Sci. 2011, 108, 2651.
J. Am. Chem. Soc. 2014, 136, 16128.
Nature Chemistry, 2013, 5, 1042-1048.
J. Am. Chem. Soc., 2016, 138 (18), pp. 6020-6027.

* cited by examiner

POLYMERIC DIELECTRICS, METHODS OF MANUFACTURING THE SAME, AND ELECTRONIC DEVICES AND THIN FILM TRANSISTORS INCLUDING THE SAME

CROSS-REFERENCE TO RELATED APPLICATION

This application claims the benefit of U.S. Provisional Application No. 62/335,254, filed on May 12, 2016, the entire disclosure of which is incorporated herein by reference.

BACKGROUND

1. Field

A polymeric dielectric, a method of manufacturing the same, a composition for a polymeric dielectric, an electronic device, and a thin film transistor are disclosed.

2. Description of Related Art

The recent development of portable and smart electronics has changed the way humans interact and communicate with electronic devices. For example, intimate contact between humans and electronic devices has continuously been improving, with anticipation that, in the near future, wearable electronic devices may act as a second skin for humans to interact and communicate with other humans and electronics for various applications.

As a result, deformable electronic materials (e.g., polymer semiconductor materials) that can be stretched similarly to human skin and are able to endure various human motions is an expanding field that has attracted increasing attention.

SUMMARY

Embodiments provide a polymeric dielectric capable of satisfying mechanical characteristics, electrical characteristics, and stretchability simultaneously.

Embodiments provide a method of manufacturing a polymeric dielectric.

Embodiments provide an electronic device including a polymeric dielectric.

Embodiments provide a thin film transistor including a polymeric dielectric.

Embodiments provide a composition for forming a polymeric dielectric.

According to some example embodiments, a polymeric dielectric may include a coordination complex of a modified elastic polymer and a metal cation. The modified elastic polymer may include an organic ligand moiety that coordinates the metal cation in a main chain of an elastic polymer.

In some example embodiments, the organic ligand moiety may include a heterocycle having at least one nitrogen.

In some example embodiments, the organic ligand moiety may include one of a pyridine moiety, a bipyridine moiety, a terpyridine moiety, a pyrimidine moiety, a bipyrimidine moiety, a terpyrimidine moiety, a phenanthroline moiety, or a combination thereof.

In some example embodiments, the organic ligand moiety may further include an acyl amide bound to the heterocycle.

In some example embodiments, the organic ligand moiety may include 2,2'-bipyridine-5,5'-dicarboxylic amide.

In some example embodiments, the metal cation may be coordinated with a nitrogen atom of the organic ligand moiety.

In some example embodiments, the elastic polymer may be a non-polar elastic polymer.

In some example embodiments, the elastic polymer may include one of polyurethane, polysiloxane, polydimethylsiloxane, polybutadiene, a styrene-butadiene copolymer, a styrene-butadiene-styrene copolymer, a styrene-ethylene-butylene-styrene copolymer, an ethylene propylene diene rubber, an acrylic rubber, a polychloroprene rubber, a silicone rubber, or a combination thereof.

In some example embodiments, the elastic polymer may be a polysiloxane having a siloxane repeating unit or a polydimethylsiloxane having a dimethylsiloxane repeating unit, and the organic ligand moiety may be linked with terminal ends of 10 to 200 siloxane repeating units or dimethylsiloxane repeating units.

In some example embodiments, the elastic polymer may be a polysiloxane having a siloxane repeating unit or a polydimethylsiloxane having a dimethylsiloxane repeating unit, and the elastic polymer may include 20 to 200 repeating units including the organic ligand moiety and the siloxane repeating unit or the organic ligand moiety and the dimethylsiloxane repeating unit.

In some example embodiments, the organic ligand moiety may be included in an amount of about 0.01 mmol to about 10 mmol relative to 1 g of the elastic polymer.

In some example embodiments, the modified elastic polymer may be represented by Chemical Formula 1.

[Chemical Formula 1]

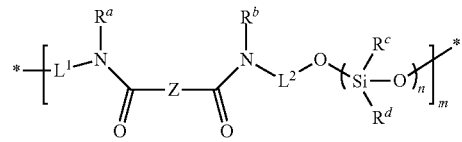

In Chemical Formula 1,

Z is a divalent heterocyclic group having at least one nitrogen, $L^1$ and $L^2$ are independently a substituted or unsubstituted C1 to C10 alkyl group, $R^a$ and $R^b$ are independently hydrogen or a substituted or unsubstituted C1 to C10 alkyl group, $R^c$ and $R^d$ are independently hydrogen or a methyl group, n is 10 to 200, and m is 20 to 200.

In some example embodiments, the metal cation may be a multivalent metal cation.

In some example embodiments, the metal cation may be one of $Zn^{2+}$, $Fe^{2+}$, $Cu^{2+}$, $Ni^{2+}$, $Co^{2+}$, $Ru^{2+}$, $Zn^{3+}$, $Fe^{3+}$, $Ln^{3+}$, or a combination thereof.

In some example embodiments, the polymeric dielectric may further include a counter anion that is disposed adjacent to the metal cation.

In some example embodiments, the counter anion may include one of a chloride ($Cl^-$), a tetrafluoroborate ($BF_4^-$), perchlorate ($ClO_4^-$), a trifluoromethanesulfonate ($CF_3SO_3^-$), a hexafluorophosphate ($PF_6^-$), a nitrate, an acetate, a phosphate, or a combination thereof.

In some example embodiments, the polymeric dielectric may have a dielectric constant of about 3.0 to about 3.6.

In some example embodiments, the polymeric dielectric may have a tensile strength of about 100% to about 400%.

According to some example embodiments, an electronic device may include the polymeric dielectric.

According to some example embodiments, a thin film transistor includes a gate electrode, a semiconductor overlapping with the gate electrode, a gate dielectric layer between the gate electrode and the semiconductor, and a source electrode and a drain electrode electrically connected to the semiconductor. The gate dielectric layer may include the polymeric dielectric.

According to some example embodiments, a composition for a polymeric dielectric includes a modified elastic polymer including an organic ligand moiety in a main chain of an elastic polymer, and a metal salt compound.

In some example embodiments, the metal salt compound may be included in an amount of about 0.1 mol to about 1 mol relative to 1 mol of the organic ligand moiety.

In some example embodiments, the modified elastic polymer and the metal salt compound may be included in a mole ratio of about 1:5 to about 5:1.

In some example embodiments, the elastic polymer may include one of polyurethane, polysiloxane, polydimethylsiloxane, polybutadiene, a styrene-butadiene copolymer, a styrene-butadiene-styrene copolymer, a styrene-ethylene-butylene-styrene copolymer, an ethylene propylene diene rubber, an acrylic rubber, a polychloroprene rubber, a silicone rubber, or a combination thereof. The organic ligand moiety may include one of a pyridine moiety, a bipyridine moiety, a terpyridine moiety, a pyrimidine moiety, a bipyrimidine moiety, a terpyrimidine moiety, a phenanthroline moiety or a combination thereof.

In some example embodiments, the metal salt compound may include one of $FeCl_2$, $ZnCl_2$, $Fe(BF_4)_2$, $Zn(BF_4)_2$, $Fe(CF_3SO_3)_2$, $Zn(CF_3SO_3)_2$, $Fe(ClO_4)_2$, $Zn(ClO_4)_2$, or a combination thereof.

In some example embodiments, the composition for polymeric dielectric may be gelated.

According to some example embodiments, a method of manufacturing a polymeric dielectric includes preparing a modified elastic polymer including an organic ligand moiety in a main chain of an elastic polymer, preparing a composition including a mixture of the modified elastic polymer, coating the composition on a substrate, and drying the composition. The mixture of the modified elastic polymer may include a metal salt compound and a solvent.

In some example embodiments, the preparing the modified elastic polymer may include reacting an elastic polymer precursor with a nitrogen-containing heterocyclic compound. The elastic polymer precursor may include an amino group at a terminal end of the elastic polymer precursor. The nitrogen-containing heterocyclic compound may include an acyl chloride at a terminal end of the nitrogen-containing heterocyclic compound.

In some example embodiments, the elastic polymer precursor may include bis-amine terminated polydimethylsiloxane and the nitrogen-containing heterocyclic compound may include 2,2'-bipyridine 5,5'-dicarboxylic acid chloride.

Mechanical characteristics, electrical characteristics, and stretchability of polymeric dielectric may be simultaneously satisfied.

BRIEF DESCRIPTION OF THE DRAWINGS

The foregoing and other features of inventive concepts will be apparent from the more particular description of non-limiting embodiments with reference to the following drawings.

DETAILED DESCRIPTION

Figure 1:
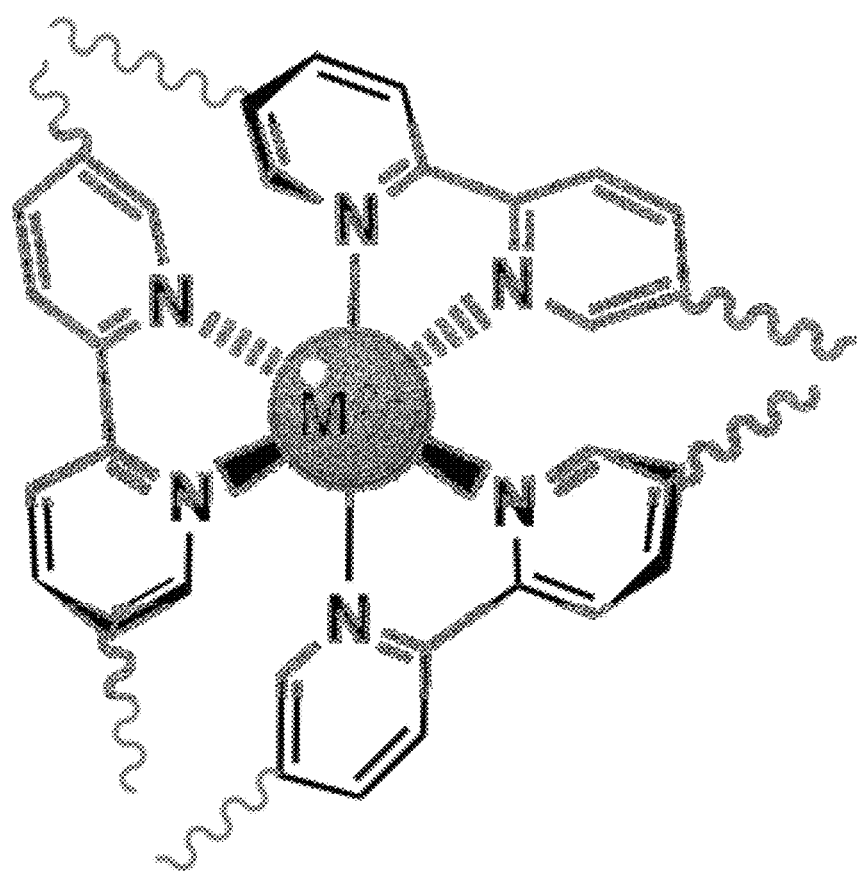
FIG. 1 is a schematic view showing a metal-ligand coordination complex of a modified elastic polymer including a bipyridine moiety and a divalent metal cation as one example of polymeric dielectric according to an embodiment.

Hereinafter, example embodiments will be described in detail so that a person skilled in the art would understand the same. This disclosure may, however, be embodied in many different forms and is not construed as limited to the example embodiments set forth herein.

As used herein, when a definition is not otherwise provided, 'substituted' refers to replacement of hydrogen of a compound by a substituent selected from a halogen, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C1 to C20 haloalkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and a combination thereof.

Hereinafter, 'combination' refers to a mixture or a laminate structure of two or more.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, polymeric dielectrics according to some example embodiments are described.

A polymeric dielectric according to some example embodiments may include a coordination complex of a modified elastic polymer and a metal cation.

The modified elastic polymer may have a structure where an organic ligand moiety capable of coordinating the metal cation is introduced into a main chain of the elastic polymer.

The elastic polymer may be a homopolymer or a copolymer having a desired (and/or alternatively predetermined) elasticity but is not particularly limited, and may be for example a non-polar elastic polymer. The elastic polymer may include, for example, polyurethane, polysiloxane, polydimethylsiloxane, polybutadiene, a styrene-butadiene copolymer, a styrene-butadiene-styrene copolymer, a styrene-ethylene-butylene-styrene copolymer, an ethylene propylene diene rubber, an acrylic rubber, a polychloroprene rubber, a silicone rubber, or a combination thereof, but is not limited thereto. For example, the elastic polymer may be polysiloxane having a siloxane repeating unit, polydimethylsiloxane having a dimethylsiloxane repeating unit, or a combination thereof.

The organic ligand moiety may be a ligand capable of coordinating the metal cation, but is not particularly limited, and may include for example a heterocycle including at least one nitrogen. For example, the metal cation may coordinate the nitrogen atom of the organic ligand moiety.

For example, the organic ligand moiety may include a pyridine moiety, a bipyridine moiety, a terpyridine moiety, a pyrimidine moiety, a bipyrimidine moiety, a terpyrimidine moiety, a phenanthroline moiety or a combination thereof. For example, the organic ligand moiety may include a bidendate ligand moiety, for example a bipyridine moiety, a bipyrimidine moiety, a phenanthroline moiety, or a combination thereof.

For example, the organic ligand moiety may further include an acyl amide bound to one side or both sides of the heterocycle having at least one nitrogen. For example, the organic ligand moiety may include bipyridine-dicarboxylic amide. For example, the organic ligand moiety may include 2,2'-bipyridine-5,5'-dicarboxylic amide.

The modified elastic polymer may have a structure where an organic ligand moiety is introduced into a main chain of the elastic polymer, for example an organic ligand moiety is introduced into at least one of repeating units derived from the elastic polymer (hereinafter, referred to as 'first repeating units'). The first repeating units may be for example siloxane repeating units or dimethylsiloxane repeating units.

For example, the modified elastic polymer may have a structure where a pyridine moiety, a bipyridine moiety, a terpyridine moiety, a pyrimidine moiety, a bipyrimidine moiety, a terpyrimidine moiety, a phenanthroline moiety, or a combination thereof is introduced into at least one of first repeating units such as siloxane repeating units or dimethylsiloxane repeating units.

For example, the modified elastic polymer may have a structure where a pyridine moiety, a bipyridine moiety, a terpyridine moiety, a pyrimidine moiety, a bipyrimidine moiety, a terpyrimidine moiety, a phenanthroline moiety, or a combination thereof and acyl amide bound to one side or both sides of these moieties are introduced into at least one of first repeating units such as siloxane repeating units or dimethylsiloxane repeating units.

For example, the organic ligand moiety may be linked with the terminal ends of 10 to 200 first repeating units that are linked consecutively.

For example, the organic ligand moiety may be included in an amount of about 0.01 mmol to about 10 mmol relative to 1 g of the elastic polymer.

For example, the modified elastic polymer may include 20 to 200 second repeating units including the first repeating units and the organic ligand moiety.

For example, the modified elastic polymer may include an organic ligand moiety including a nitrogen-containing heterocycle and an acyl amide group in polysiloxane having a siloxane repeating unit or polydimethylsiloxane having a dimethylsiloxane repeating unit, and may be for example represented by Chemical Formula 1.

[Chemical Formula 1]

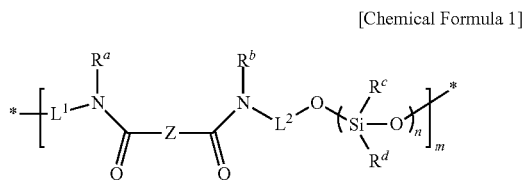

In Chemical Formula 1,

Z is a divalent heterocyclic group having at least one nitrogen, $L^1$ and $L^2$ are independently a substituted or unsubstituted C1 to C10 alkyl group, $R^a$ and $R^b$ are independently hydrogen or a substituted or unsubstituted C1 to C10 alkyl group, $R^c$ and $R^d$ are independently hydrogen or a methyl group, n is 10 to 200, and m is 20 to 200.

For example, in Chemical Formula 1, Z may be a pyridine moiety, a bipyridine moiety, a terpyridine moiety, a pyrimidine moiety, a bipyrimidine moiety, a terpyrimidine moiety, a phenanthroline moiety or a combination thereof.

For example, in Chemical Formula 1, $L^1$ and $L^2$ may independently be an ethyl group, a propyl group, or a butyl group.

For example, in Chemical Formula 1, $R^a$ and $R^b$ may independently be hydrogen.

For example, in Chemical Formula 1, n may be 20 to 150, for example 30 to 100.

For example, in Chemical Formula 1, m may be 30 to 150, for example 50 to 120, for another example 70 to 100.

For example, the modified elastic polymer may be represented by Chemical Formula 1a.

[Chemical Formula 1a]

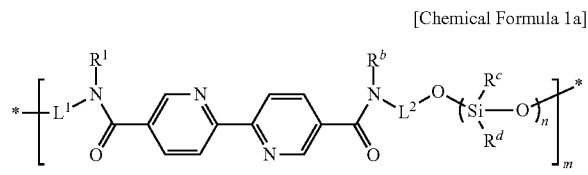

In Chemical Formula 1a, $L^1$, $L^2$, $R^a$ to $R^d$, n, and m are the same as described above.

For example, the modified elastic polymer may be represented by Chemical Formula 1aa.

In Chemical Formula 1aa, n and m are the same as described above.

As described above, the modified elastic polymer may form a coordination complex with the metal cation due to the organic ligand moiety capable of coordinating the metal cation in the main chain.

The metal cation may be for example a multivalent metal cation, for example $Zn^{2+}$, $Fe^{2+}$, $Cu^{2+}$, $Ni^{2+}$, $Co^{2+}$, $Ru^{2+}$, $Zn^{3+}$, $Fe^{3+}$, $Ln^{3+}$, or a combination thereof. For example, the metal cation may be $Zn^{2+}$ or $Fe^{2+}$.

The metal-ligand coordination complex may have for example a tetrahedral coordination or an octahedral coordination. In this way, the metal-ligand coordination complex may relax a structural stress easily due to a tetrahedral coordination or an octahedral coordination and thus improve stretchability.

A coordination structure may be for example determined by a counter anion of the metal cation. The counter anion may include for example a chloride ($Cl^-$), a tetrafluoroborate ($BF_4^-$), a perchlorate ($ClO_4^-$), a trifluoromethanesulfonate ($CF_3SO_3^-$), a hexafluorophosphate ($PF_6^-$), a nitrate, an acetate, a phosphate, or a combination thereof, but is not limited thereto.

The counter anion may be neighbored with the metal cation through a coulombic interaction of the metal cation and thus may decrease or prevent drifting of mobile ions in the polymeric dielectric and thus increase electrical stability when a gate voltage is applied to an electronic device.

FIG. 1 is a schematic view showing a metal-ligand coordination complex of a modified elastic polymer including a bipyridine moiety and a metal cation as one example of polymeric dielectric according to an embodiment.

In FIG. 1, $M^{2+}$ indicates divalent metal cations, and a wave mark indicates an omitted part of a polymer main chain including an elastic polymer repeating unit.

The metal cations may be respectively coordinated with a plurality of modified main chain of the elastic polymer and thus cross-link elastic polymer main chains. In other words, the elastic polymer chains may be consecutively cross-linked through a metal-ligand coordination between organic ligand moiety and metal cation. Accordingly, since the polymeric dielectric has high stretchability under an ambient condition, a thin film including the polymeric dielectric may be rapidly self-healed despite repetitive stretching, and even when the thin film is broken, the thin film may have self-healing characteristics due to easy recombination of the polymeric dielectric.

In addition, the polymeric dielectric may have high polarizability due to metal-ligand coordination bonds and thus may increase a dielectric constant. A dielectric constant of polymeric dielectric may be for example about 3.0 to about 3.6.

In addition, the polymeric dielectric may have a tensile strength, for example a tensile strength of about 100% to about 400%, for another example about 100% to about 300%.

[Chemical Formula 1aa]

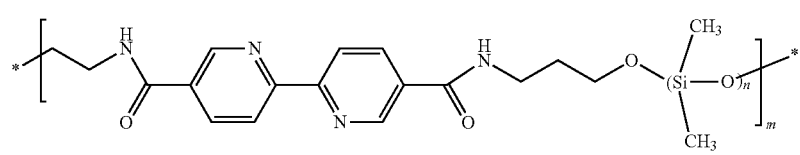

Hereinafter, one example of a method of manufacturing a polymeric dielectric is explained.

A method of manufacturing a polymeric dielectric according to example embodiment includes preparing a modified elastic polymer including an organic ligand moiety in a main chain of an elastic polymer, preparing a composition including modified elastic polymer, a metal salt compound and a solvent, and coating and drying the composition.

The modified elastic polymer may be obtained by reacting an elastic polymer precursor and a compound for forming an organic ligand.

The elastic polymer precursor may include for example an amine group (—$NH_2$) at a terminal end of the elastic polymer precursor. The elastic polymer precursor include, for example, an amine group (—$NH_2$) introduced at the terminal end of polyurethane, polysiloxane, polydimethylsiloxane, polybutadiene, a styrene-butadiene copolymer, a styrene-butadiene-styrene copolymer, a styrene-ethylene-butylene-styrene copolymer, an ethylene propylene diene rubber, an acrylic rubber, a polychloroprene rubber, a silicone rubber, or a combination thereof. For example, the elastic polymer precursor may be a compound including an amine group at the terminal end of the polysiloxane having a siloxane repeating unit or a compound including an amine group at the terminal end of the polydimethylsiloxane having a dimethylsiloxane repeating unit. For example, the elastic polymer precursor may include bis-amine terminated polydimethylsiloxane, for example bis(aminoalkyl) terminated polydimethylsiloxane, for example bis(3-aminopropyl) terminated polydimethylsiloxane.

The compound for forming an organic ligand may be for example a nitrogen-containing heterocyclic compound, for example a compound including pyridine, bipyridine, terpyridine, pyrimidine, bipyrimidine, terpyrimidine, phenanthroline, or a combination thereof as a main structure, and may have a structure where acyl chloride (—COCl) is for example introduced into terminal ends of the foregoing moieties as a functional group. For example, the compound for forming an organic ligand may include 2,2'-bipyridine 5,5'-dicarboxylic acid chloride.

The modified elastic polymer may be obtained by a coupling reaction, for example an amide condensation reaction of the elastic polymer precursor and the compound for forming an organic ligand.

The composition for polymeric dielectric may be a solution, for example a gelated solution. The metal salt compound may be for example $FeCl_2$, $ZnCl_2$, $Fe(BF_4)_2$, $Zn(BF_4)_2$, $Fe(CF_3SO_3)_2$, $Zn(CF_3SO_3)_2$, $Fe(ClO_4)_2$, $Zn(ClO_4)_2$, or a combination thereof. For example, the metal salt compound may be included in an amount of about 0.1 mol to about 1 mol relative to 1 mol of the organic ligand moiety of the modified elastic polymer. For example, the modified elastic polymer and the metal salt compound may be included in a mole ratio of about 1:5 to about 5:1.

The solvent is not particularly limited as long as the solvent may dissolve and/or disperse the modified elastic polymer and the metal salt compound, and may be for example chloroform, chlorobenzene, toluene, methylene chloride, dimethylformaldehyde, tetrahydrofuran, dimethylsulfoxide, xylene, tetralin, methanol, ethanol, or a combination thereof, but is not limited thereto.

The composition for polymeric dielectric may be coated by a solution process and may be for example coated by spin coating, slit coating, bar coating, dip coating, spray coating, inkjet printing, and the like, but is not limited thereto. The composition for polymeric dielectric may be for example coated by spin coating.

The polymeric dielectric may be applied to various fields requiring dielectric characteristics and/or insulating characteristics, for example, directly applied on a substrate to form a dielectric layer or transferred onto an elastic substrate after forming the dielectric layer on the substrate to form a transferred dielectric layer.

The dielectric layer may be applied to various electronic devices, for example, a thin film transistor, for example, an electronic device such as a solar cell, a liquid crystal display, an organic light emitting diode (OLED) display, and an organic sensor. In addition, the electronic device may be a stretchable organic light emitting diode (OLED) display, a stretchable human motion sensor, an artificial stretchable human muscle, or a stretchable actuator.

Hereinafter, an example embodiment of a thin film transistor is described with reference to the drawing.

Figure 2:
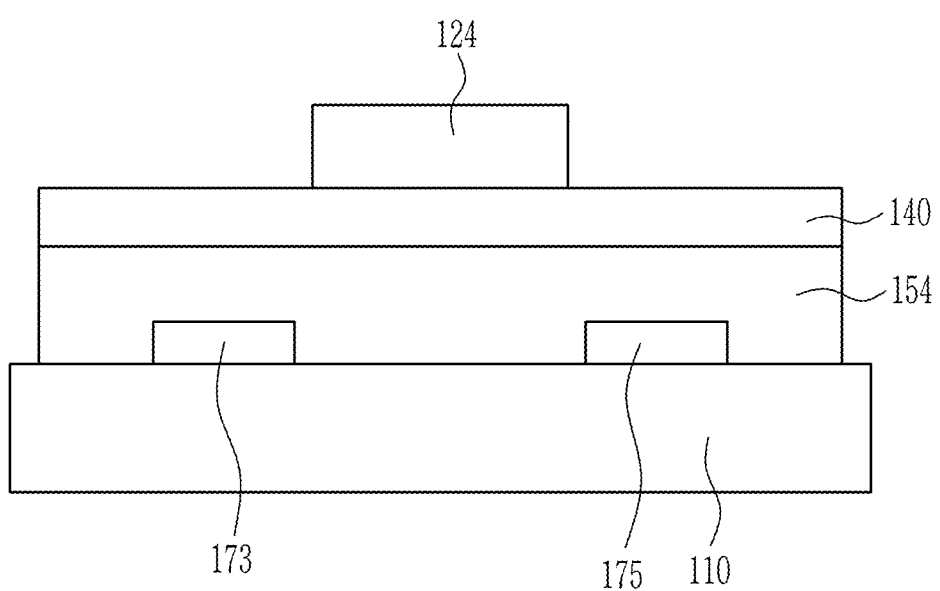
FIG. 2 is a cross-sectional view showing a thin film transistor according to an embodiment.

FIG. 2 is a cross-sectional view showing a thin film transistor according to example embodiments.

A source electrode 173 and a drain electrode 175 are formed on formed on a substrate 110 made of transparent glass, silicon, or plastic. The source electrode 173 is electrically connected to a data line (not shown) transferring a data signal. The source electrode 173 and the drain electrode 175 may include at least one metal selected from gold (Au), copper (Cu), nickel (Ni), aluminum (Al), molybdenum (Mo), chromium (Cr), tantalum (Ta), titanium (Ti), an alloy thereof, or a combination thereof.

A semiconductor 154 is formed on the source electrode 173 and the drain electrode 175. The semiconductor 154 may be for example an organic semiconductor. The organic semiconductor may be for example a low molecular organic semiconductor or a polymeric organic semiconductor. The organic semiconductor may be for example donor-acceptor type organic semiconductor having an electron donor moiety and an electron acceptor moiety.

A gate dielectric layer 140 is formed on the semiconductor 154. The gate dielectric layer 140 may include the polymeric dielectric.

A gate electrode 124 is formed on the gate dielectric layer 140. The gate electrode 124 overlaps at least one part of the semiconductor 154. The gate electrode 124 is connected to a gate line (not shown) transferring a gate signal. The gate electrode 124 may be doped at a high concentration in a silicon substrate or may be made of gold (Au), copper (Cu), nickel (Ni), aluminum (Al), molybdenum (Mo), chromium (Cr), tantalum (Ta), titanium (Ti), an alloy thereof, or a combination thereof.

Although a thin film transistor having a bottom contact/top gate structure illustrated, it is not limited thereto, and it may be applied to all thin film transistors such as a bottom contact/bottom gate structure, a top contact/bottom gate structure, a top contact/top gate structure in the same manner.

The thin film transistor may be applied to a switch or driving device of various electronic devices and the electronic device may be for example a liquid crystal display (LCD), an organic light emitting diode (OLED) display, an electrophoretic display, an organic photoelectric device, and an organic sensor, but is not limited thereto.

Hereinafter, the embodiments are illustrated in more detail with reference to examples. However, these examples are non-limiting, and the present scope is not limited thereto.

Preparation Examples

[Reaction Scheme 1]

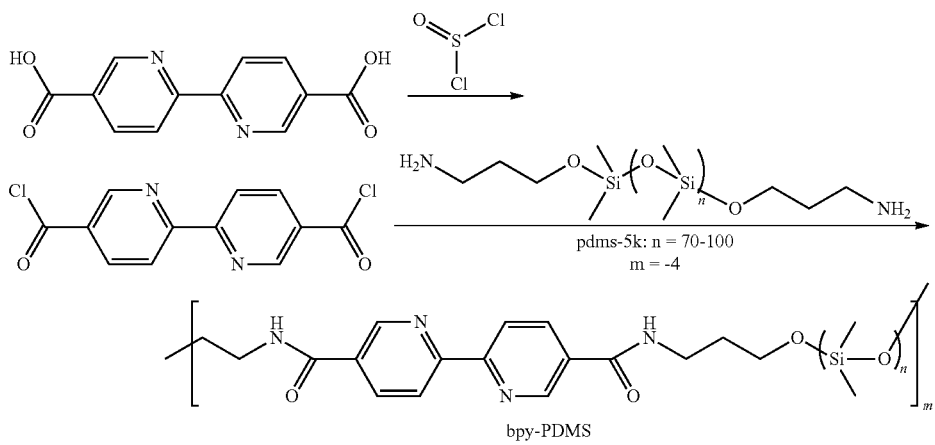

Synthesis of 2,2'-Bipyridine 5,5'-Dicarboxylic Acid Chloride 1 g of 2,2'-bipyridine 5,5'-dicarboxylic acid is suspended in 20 ml thionyl chloride at room temperature. A few drops of dimethylforamide are added to the aforementioned suspension, which then turned into clear red solution. The solution is continuously stirred for a few hours before the thionyl chloride is removed under vacuum. A yellowish solid left in the flask is washed a few times with cold methylene chloride to obtain 2,2'-bipyridine 5,5'-dicarboxylic acid chloride.

$^1$H NMR (300 MHz, CDCl$_3$, δ/ppm): 9.38 (s, 2H), 8.72 (dd, J=9 Hz, J=1.2 Hz, 2H), 8.54 (dd, J=9 Hz, J=1.5 Hz, 2H).

Synthesis of Bipyridine-poly(dimethylsiloxane)

Bis(3-aminopropyl) terminated poly(dimethylsiloxane) (Mn about 5000-7000, Gelest) is used for an amide condensation reaction.

10 g of bis(3-aminopropyl) terminated PDMS (<2 mmol amount of amine terminal group) and 0.56 ml diphenylamine (4 mmol) are dissolved in dry methylene chloride under nitrogen at 0° C. to prepare a polydimethylsiloxane (PDMS) solution. Subsequently, 0.56 g of 2,2'-bipyridine 5,5'-dicarboxylic acid chloride (2 mmol) is dissolved in 25 ml dry methylene chloride, then added to the polydimethylsiloxane (PDMS) solution dropwise under a nitrogen atmosphere. The solution is slowly warmed up to room temperature and stirred overnight. An obtained polymer is washed several times by being dissolved in minimal amount of methylene chloride and crushed out upon addition of methanol to obtain bipyridine-poly(dimethylsiloxane) (hereinafter, referred to as "bpy-PDMS").

Based on the $^1$H NMR proton integration, each bipyridine unit is connected to about ~102 repeating siloxane units and the molecular weight of the each repeating bpy-PDMS is about ~7800.

$^1$H NMR (300 MHz, CDCl$_3$, δ/ppm): 9.03 (s, 2H), 8.47 (d, J=9 Hz, 2H), 8.17 (d, J=9 Hz, J=1.5 Hz, 2H), 6.52 (b, 2H), 3.48 (d, J=9 Hz, 4H), 1.71 (m, 4H), 0.63 (d, J=9 Hz, 4H), 0.01 (b, 618H). Polydispersity (D): 2.2, Mn: 31,300, Mw: 67,500.

Preparation of Coordination Complex

[Reaction Scheme 2]

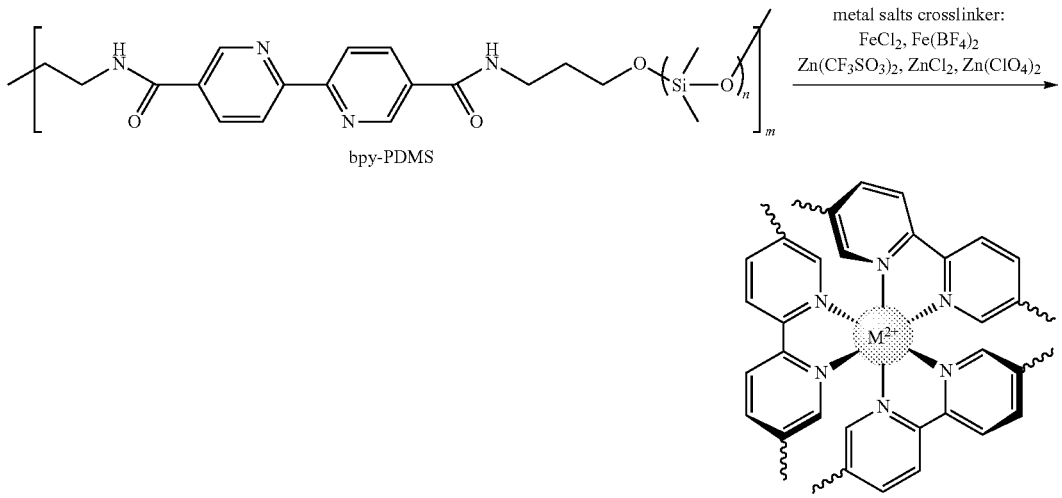

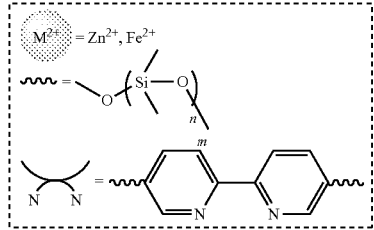

200 mg of bpy-PDMS (about 25.6 μM bipyridine units) is dissolved in 10 ml toluene to prepare a bpy-PDMS solution. A 50 μL aliquot of a methanol solution containing 8.5 μM (1:3 metal:liqand coordination geometry) crosslinking metal salts ($FeCl_2$, $Fe(BF_4)_2$, $ZnCl_2$, $Zn(ClO_4)_2$, and $Zn(OTf)_2$ is subsequently added to the bpy-PDMS solution and vigorously stirred overnight to obtain the desired polymers. For the solution gelation formation, stoichiometric amounts of metal salts are dissolved in minimal amounts of methanol (0.18 M/L) and then added into the bpy-PDMS (70 mg/ml). The resulting solution is stirred vigorously for 20 mins. The coordination complex in a gel state is formed after leaving the solution standing still for a few hours or a day.

Figure 3:
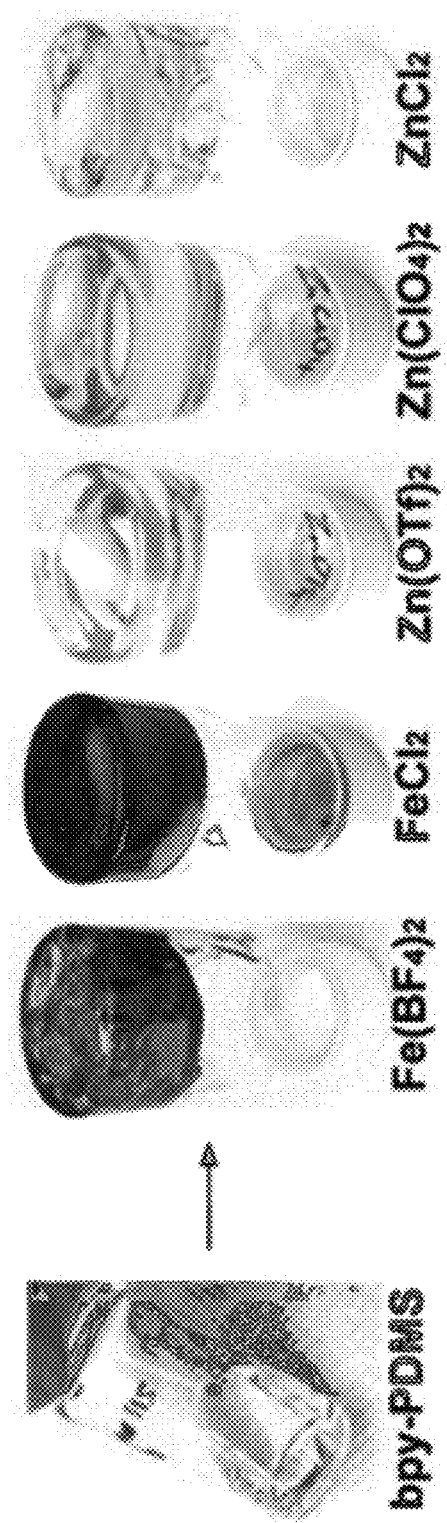
FIG. 3 is a photograph showing a gel formation of a coordination complex according to one example.

FIG. 3 is a photograph showing a gel formation of the obtained coordination complex.

Referring to FIG. 3, it is confirmed that a coordination complex in a gel state is obtained by adding the metal salt to the bpy-PDMS solution. From the results, it is confirmed that the metal salt acts as a crosslinker to cross-link the bpy-PDMS.

Hereinafter, "bpy-PDMS" denotes bipyridine-poly(dimethylsiloxane) to which the metal salt is not bound; "$FeCl_2$-PDMS" denotes a coordination complex of bpy-PDMS and $FeCl_2$, "$ZnCl_2$-PDMS" denotes a coordination complex of bpy-PDMS and $ZnCl_2$; "$Zn(OTf)_2$-PDMS" denotes a coordination complex of bpy-PDMS and $Zn(OTf)_2$; "PDMS-Fe$(BF_4)_2$" denotes a coordination complex of bpy-PDMS and $Fe(BF_4)_2$; and "PDMS-$Zn(ClO_4)_2$" denotes a coordination complex of bpy-PDMS and Deleted Texts $Zn(ClO_4)_2$.

Evaluation I
Evaluation 1: UV-Vis Absorption Titration

Based on the $^1$H NMR proton integration, each bipyridine unit is connected to about ~102 siloxane repeating units and the molecular weight of each bipyridine-polydimethylsiloxane repeating unit is about ~7800. A mole ratio of bipyridine units within 1 g of bpy-PDMS is around ~0.13 mmol.

UV-Vis absorption spectroscopy is used for confirming ion binding stoichiometry.

For the titration experiments, 7.8 mg of bpy-PDMS is dissolved in 10 ml dichloromethane with an approximately bipyridine unit concentration of about $1 \times 10^{-4}$M to prepare a bpy-PDMS solution. For UV-Vis titration study, 3 ml of bpy-PDMS solution ($1 \times 10^{-4}$ M/L) is transferred into a cuvette. Metal salts ($FeCl_2$, $Fe(BF_4)_2$, $ZnCl_2$, $Zn(ClO_4)_2$, and $Zn(OTf)_2$) are dissolved in methanol at a concentration of $3.35 \times 10^{-3}$ M/L. to prepare metal salt solutions, and 2 μL of metal salt solutions are added into the bpy-PDMS solution via a micropipette each time at room temperature. The solution containing cuvette is then shaken manually a few times to ensure homogeneous mixture. The time interval between each addition and spectra recording is around 2 minutes. The UV-Vis absorption spectra are also re-recorded after the solution sitting in the cuvette holder for an additional 5 min.

Figure 4:
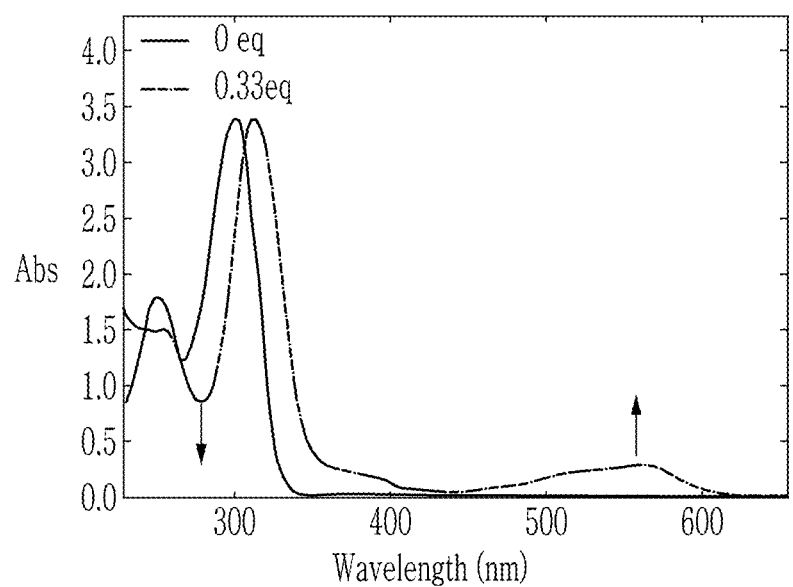
FIG. 4 is a graph showing a UV-Vis absorption titration spectrum of a coordination complex of bpy-PDMS and $FeCl_2$.
Figure 5:
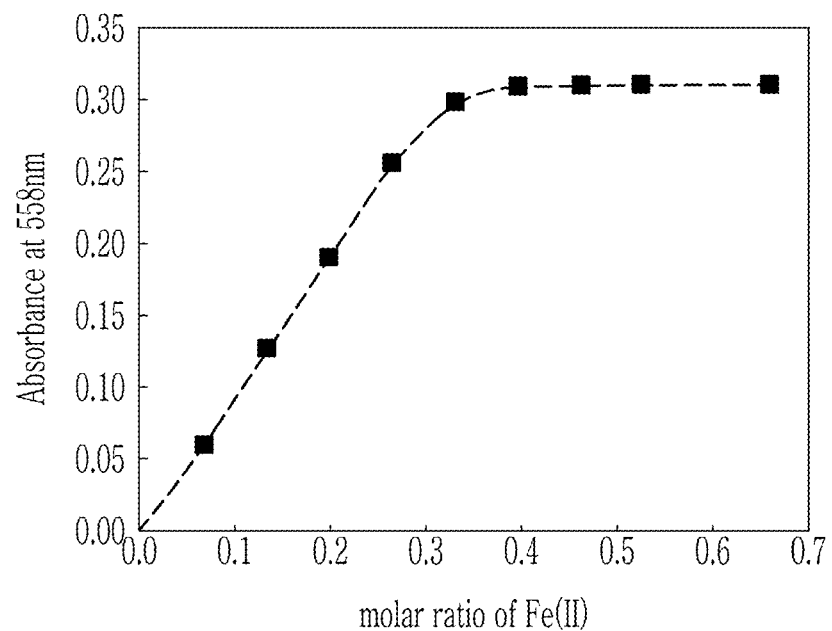
FIG. 5 is a diagram showing changes of absorbance at 558 nm depending on addition of a metal salt ($FeCl_2$) to bpy-PDMS.

FIG. 4 is a graph showing a UV-Vis absorption titration spectrum of a coordination complex of bpy-PDMS and $FeCl_2$ and FIG. 5 is a diagram showing changes of absorbance at 558 nm depending on addition of a metal salt ($FeCl_2$) to bpy-PDMS.

Figure 6:
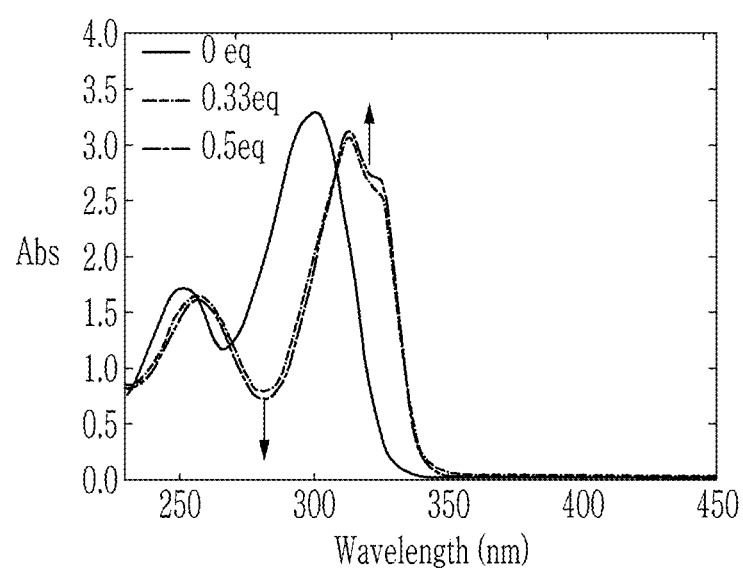
FIG. 6 is a graph showing a UV-Vis absorption titration spectrum of a coordination complex of bpy-PDMS and $Zn(ClO_4)_2$.
Figure 7:
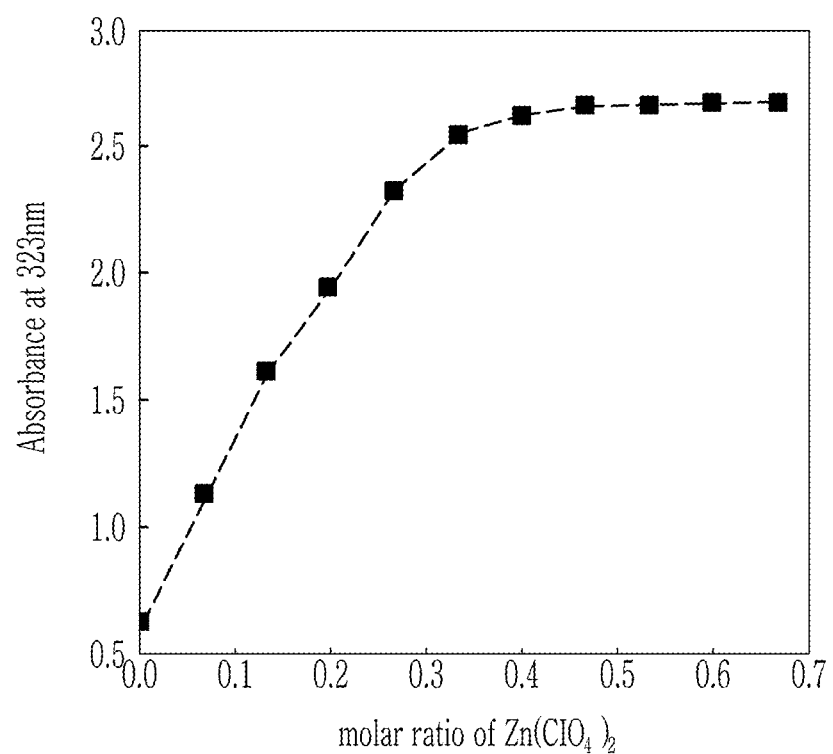
FIG. 7 is a diagram showing changes of absorbance at 323 nm depending on addition of a metal salt ($Zn(ClO_4)_2$) to bpy-PDMS.

FIG. 6 is a graph showing a UV-Vis absorption titration spectrum of a coordination complex of bpy-PDMS and $Zn(ClO_4)_2$, and FIG. 7 is a diagram showing changes of absorbance at 323 nm depending on addition of a metal salt ($Zn(ClO_4)_2$) to bpy-PDMS.

Figure 8:
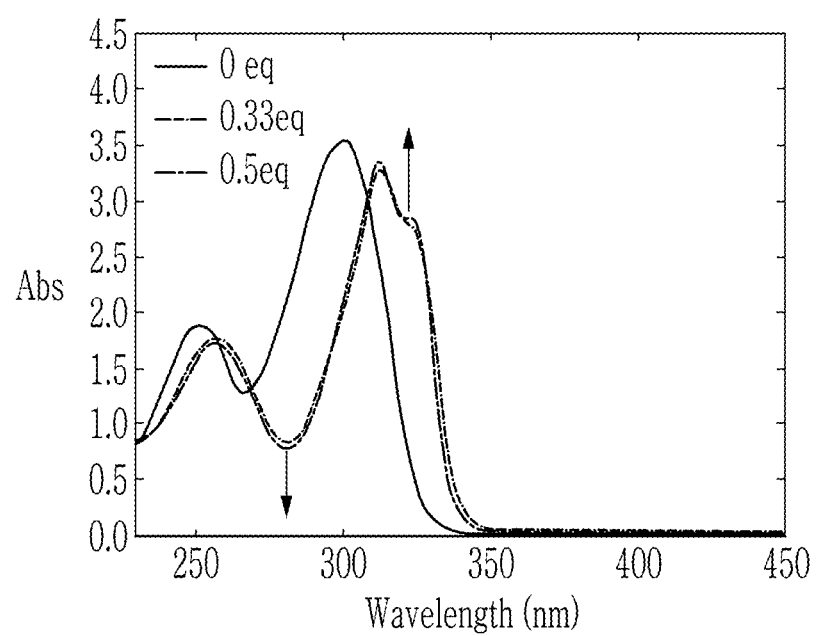
FIG. 8 is a graph showing a UV-Vis absorption titration spectrum of a coordination complex of bpy-PDMS and $Zn(OTf)_2$.
Figure 9:
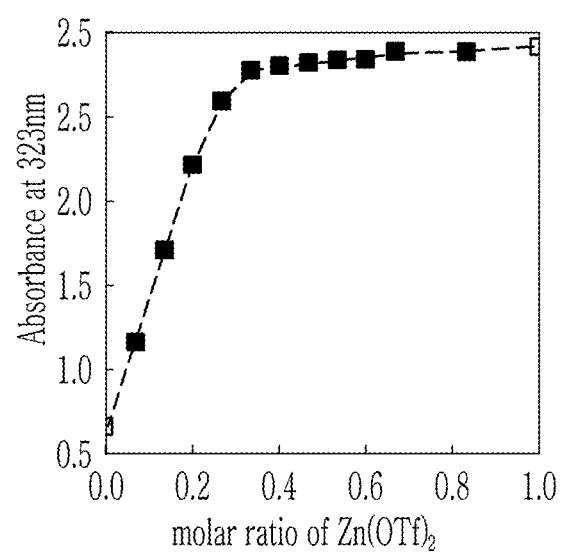
FIG. 9 is a diagram showing changes of absorbance at 323 nm depending on addition of a metal salt ($Zn(OTf)_2$) to bpy-PDMS.

FIG. 8 is a graph showing a UV-Vis absorption titration spectrum of a coordination complex of bpy-PDMS and $Zn(OTf)_2$, and FIG. 9 is a diagram showing changes of absorbance at 323 nm depending on addition of a metal salt ($Zn(OTf)_2$) to bpy-PDMS.

Figure 10:
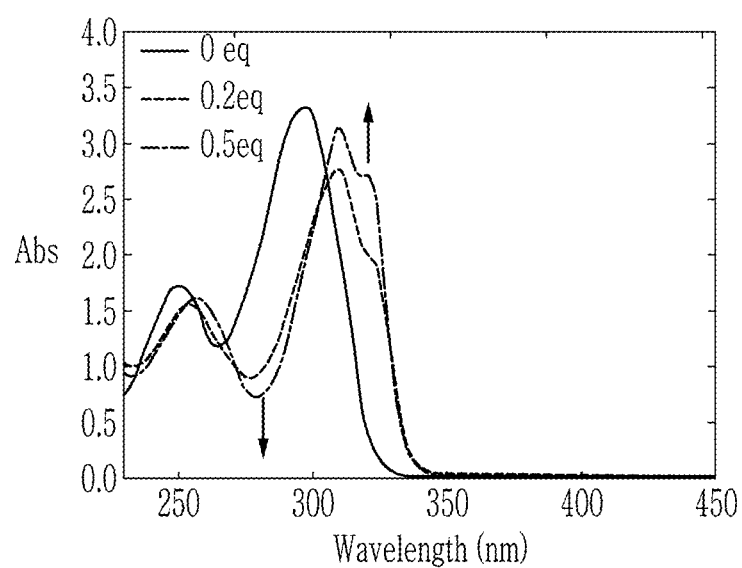
FIG. 10 is a graph showing a UV-Vis absorption titration spectrum of a coordination complex of bpy-PDMS and $ZnCl_2$.
Figure 11:
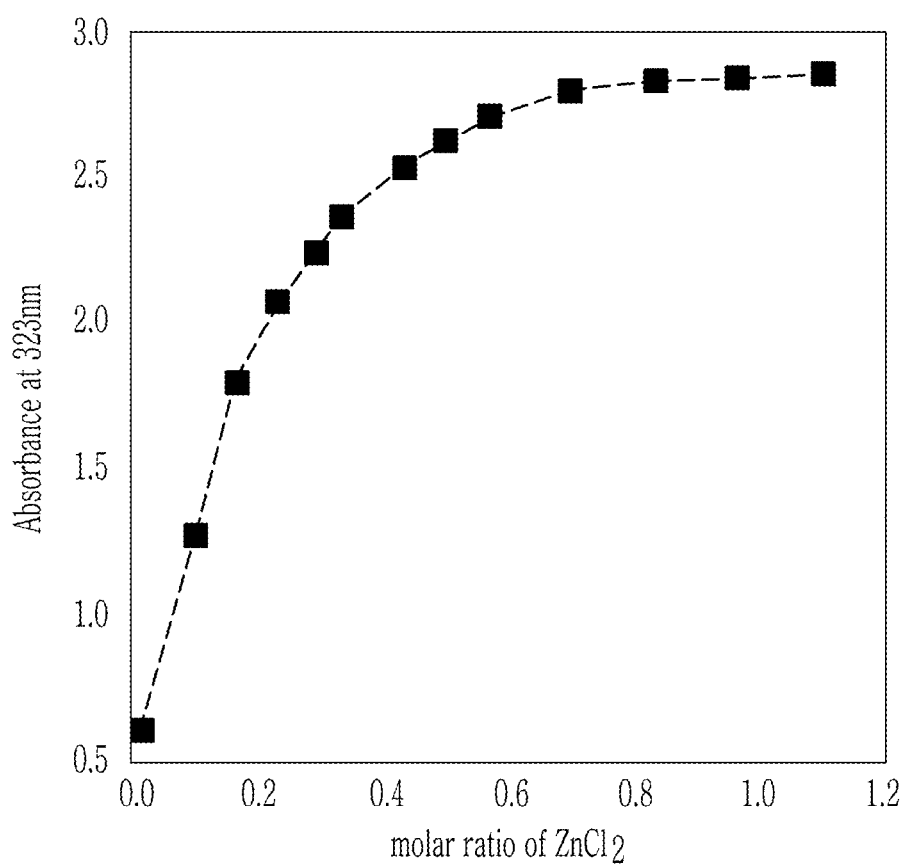
FIG. 11 is a diagram showing changes of absorbance at 323 nm depending on addition of a metal salt ($ZnCl_2$) to bpy-PDMS.

FIG. 10 is a graph showing a UV-Vis absorption titration spectrum of a coordination complex of bpy-PDMS and $ZnCl_2$, and FIG. 11 is a diagram showing changes of absorbance at 323 nm depending on addition of a metal salt ($ZnCl_2$) to bpy-PDMS.

In the UV-Vis absorption spectrum, isosbestic points indicate a chemical quantitative coordination between bipyridine and a $Fe^{2+}$ or $Zn^{2+}$ metal ion.

Referring to FIG. 4, the coordination complex of bpy-PDMS and $FeCl_2$ shows a maximum light absorption at about 558 nm, which indicates that a metal-to-ligand charge transfer electronic transition occurs.

Referring to FIG. 5, the UV-Vis absorption spectrum shows that $Fe^{2+}$ and bpy-PDMS are saturated at a mole ratio of about 1:3 and thus are coordinated as an octahedral geometry structure.

Referring to FIGS. 6, 8, and 10, an initial addition of a $Zn^{2+}$ salt ($Zn(ClO_4)_2$, $Zn(OTf)_2$, $ZnCl_2$) to the bpy-PDMS shows similar changes in the UV-Vis absorption spectrum along with a bathochromic shift of the bypyridine ligand-centered π-π* electronic transition.

Referring to FIGS. 7, 9, and 11, when $Zn(ClO_4)_2$, $Zn(OTf)_2$, and $ZnCl_2$ are consecutively added to a bipyridine moiety at room temperature up to a mole ratio of about 0.33:1, the UV-Vis absorption spectra show their saturations, which indicate that $Zn^{2+}$ and the bipyridine moiety are coordinated at a ratio of 1:3 (metal:ligand) with an octahedron geometry structure.

Evaluation 2: Thermal Properties

The obtained coordination complex is heated at a speed of 10° C./min from 25° C. to 800° C. to perform a thermogravimetric analysis (TGA). In addition, the coordination complex is heated and cooled down at a speed of 10° C./min to perform a differential scanning calorimetry (DSC). The thermogravimetric analysis and the differential scanning calorimetry are performed by using a Mettler Toledo AG-TGA/SDTA851$^e$ model.

Figure 12:
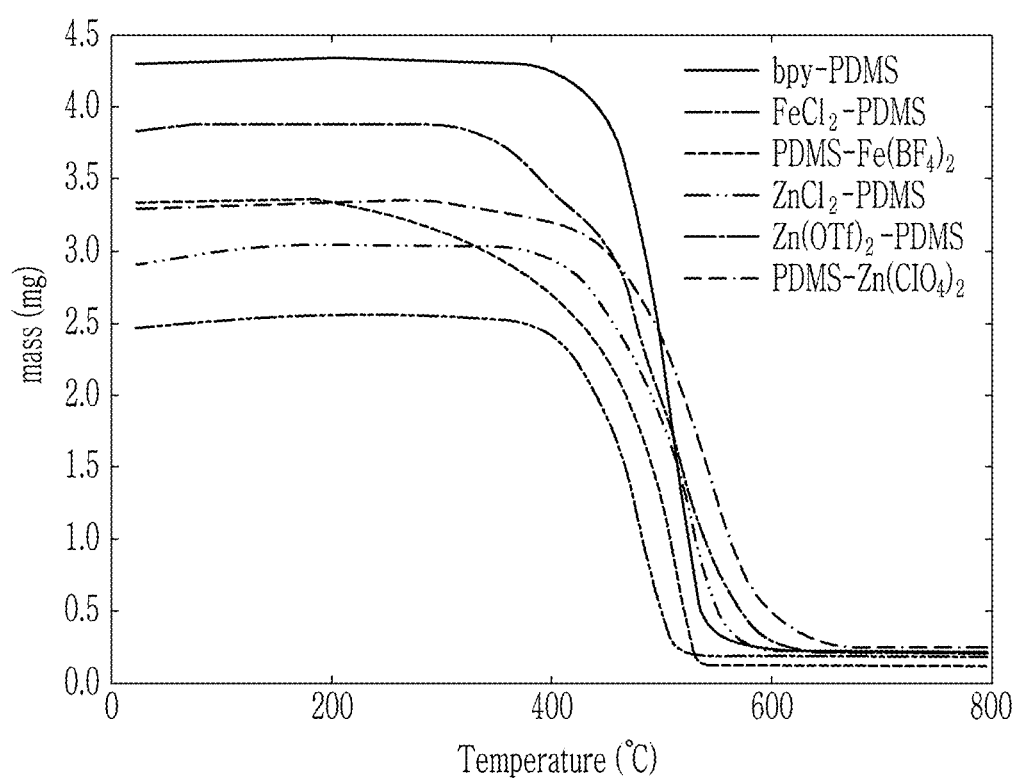
FIG. 12 is a graph showing a thermogravimetric analysis (TGA) of bpy-PDMS and coordination complexes thereof.
Figure 13:
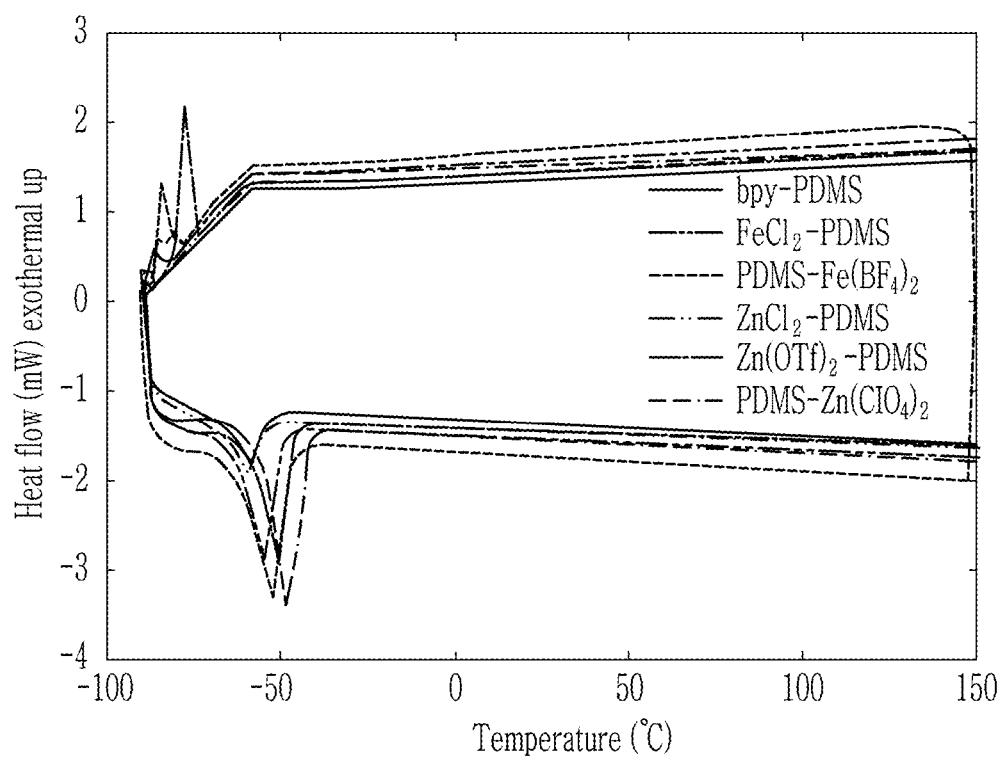
FIG. 13 is a graph showing differential scanning calorimetry (DSC) of bpy-PDMS and coordination complexes thereof.

FIG. 12 is a graph showing the thermogravimetric analysis (TGA) of bpy-PDMS and coordination complexes thereof, and FIG. 13 is a graph showing the differential scanning calorimetry (DSC) of bpy-PDMS and coordination complexes thereof.

Referring to FIG. 12, the bpy-PDMS and its coordination complex show high thermal stability. Referring to FIG. 13, a transition temperature of about −50° C. indicates melting of a metal-ligand composite area, and accordingly, a polymer backbone may have a glass transition temperature (Tg) of less than or equal to −50° C.

Manufacture of Film

A metal salt-containing bpy-PDMS solution is poured into a polytetrafluoroethene (PTFE) mold measuring 36 mm length×14 mm width×25 mm height and then, dried at room temperature for one day followed by drying under vacuum for 48 hours. Subsequently, the obtained film is peeled off from the PTFE mold and cut into individual film samples with an average sample size of 5 mm×3 mm×0.5 mm (length, width, thickness).

Evaluation II

Evaluation 3: Mechanical Characteristics

Mechanical characteristics of the film samples are evaluated by using TA Instruments DMA Q800.

The film samples are extended at displacement rate of 5 mm/min at room temperature. Each measurement is repeated at least three times. A Young's modulus (E) is determined from an initial slope of a stress-strain curves.

For stress-relaxation experiments, the film sample is equilibrated to a set temperature of 25° C. for 2 minutes, after which the film sample is displaced and held at 3% strain for ~15 min and the decay of stress over time was monitored. Standard deviations are calculated from independent measurements on the film samples under similar processing conditions.

Figure 14:
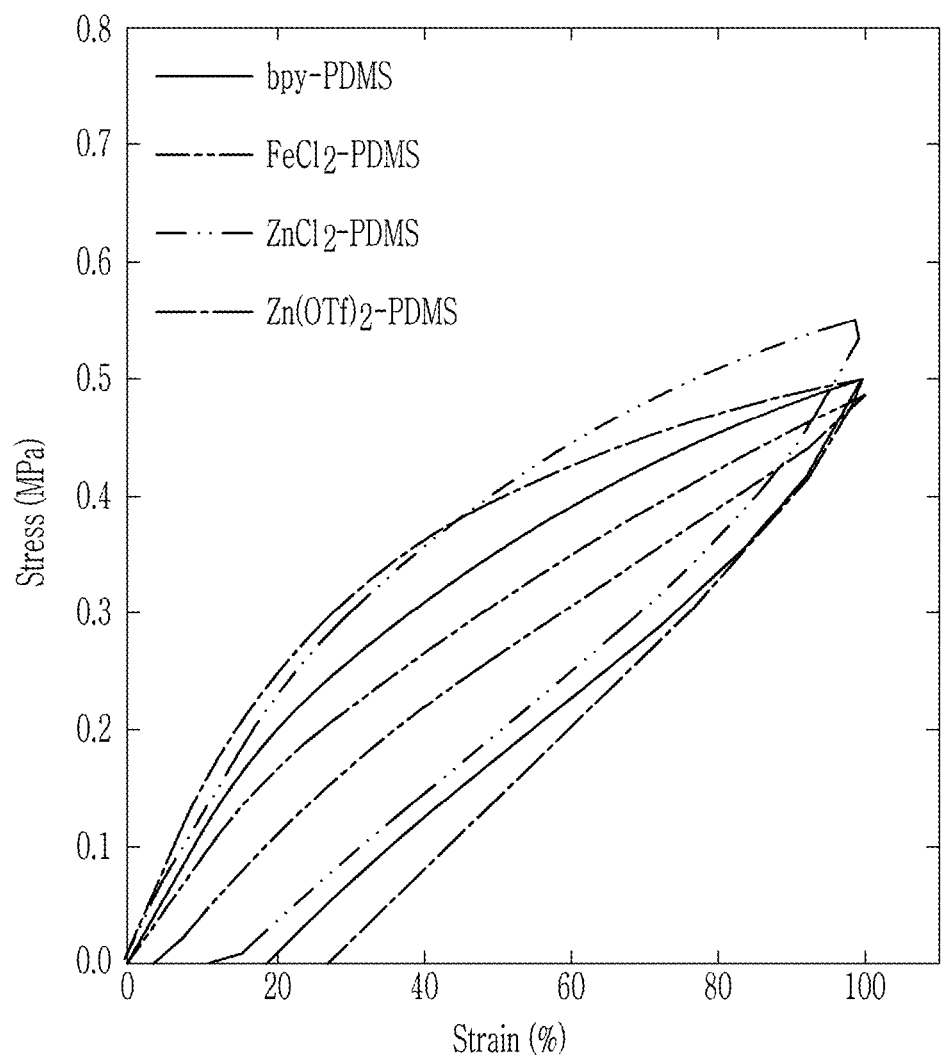
FIG. 14 is a graph showing cyclic stress-strain curves of film samples.
Figure 15:
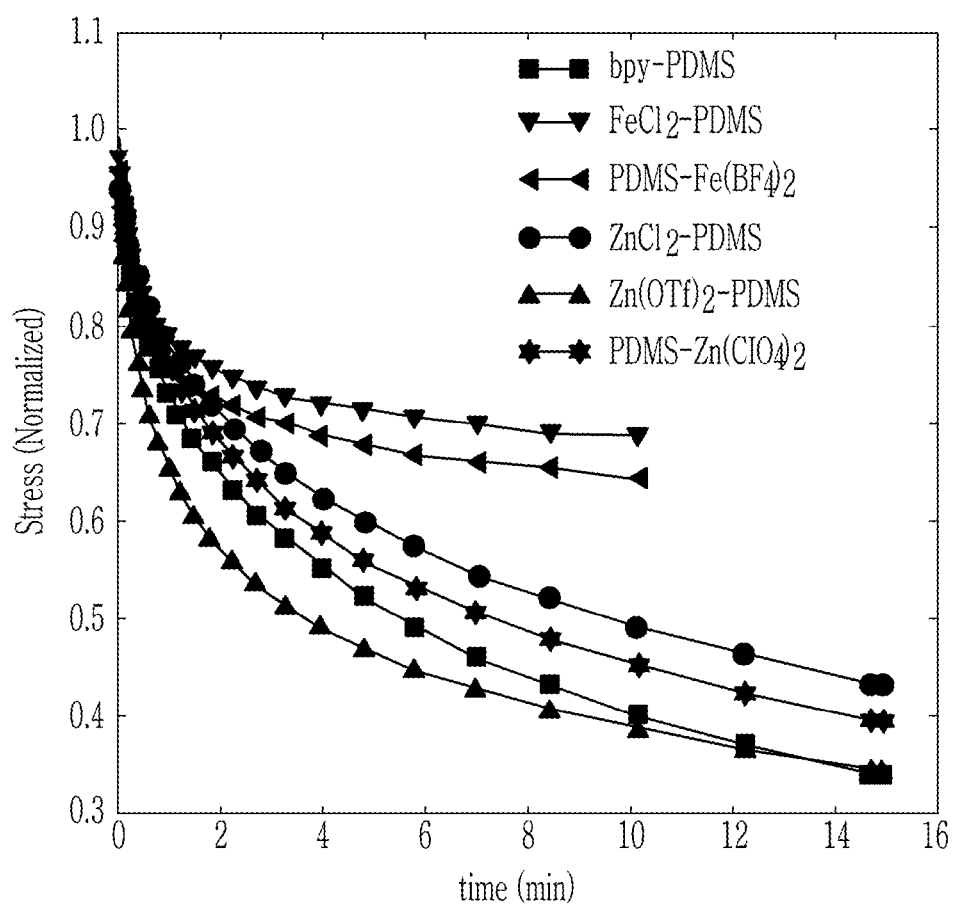
FIG. 15 is a graph showing a stress extinction degree of the film samples depending on a time.
Figure 16:
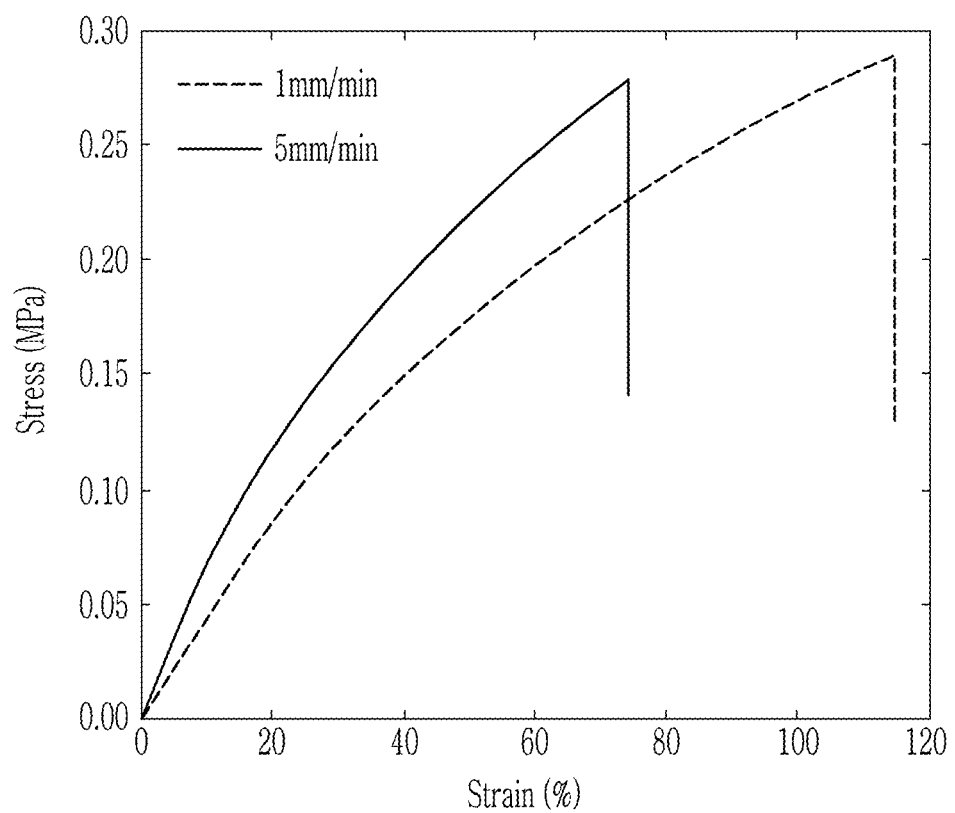
FIGS. 16 to 18 are graphs showing stress-strain curves of the film samples depending on a displacement rate.
Figure 17:
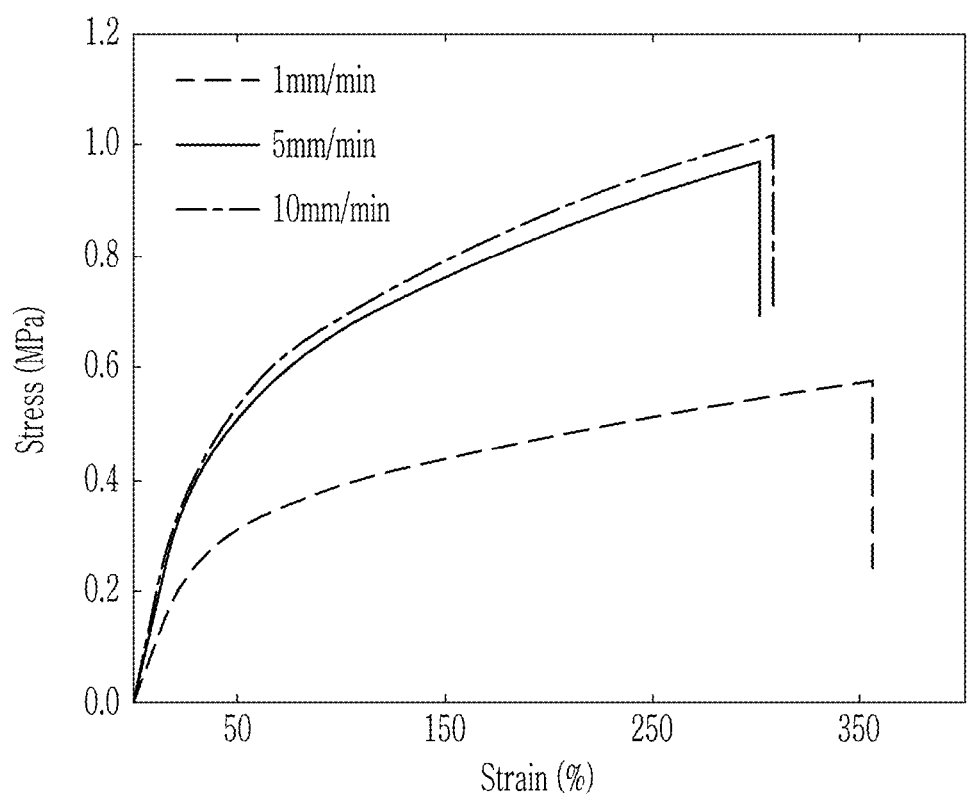
Figure 18:
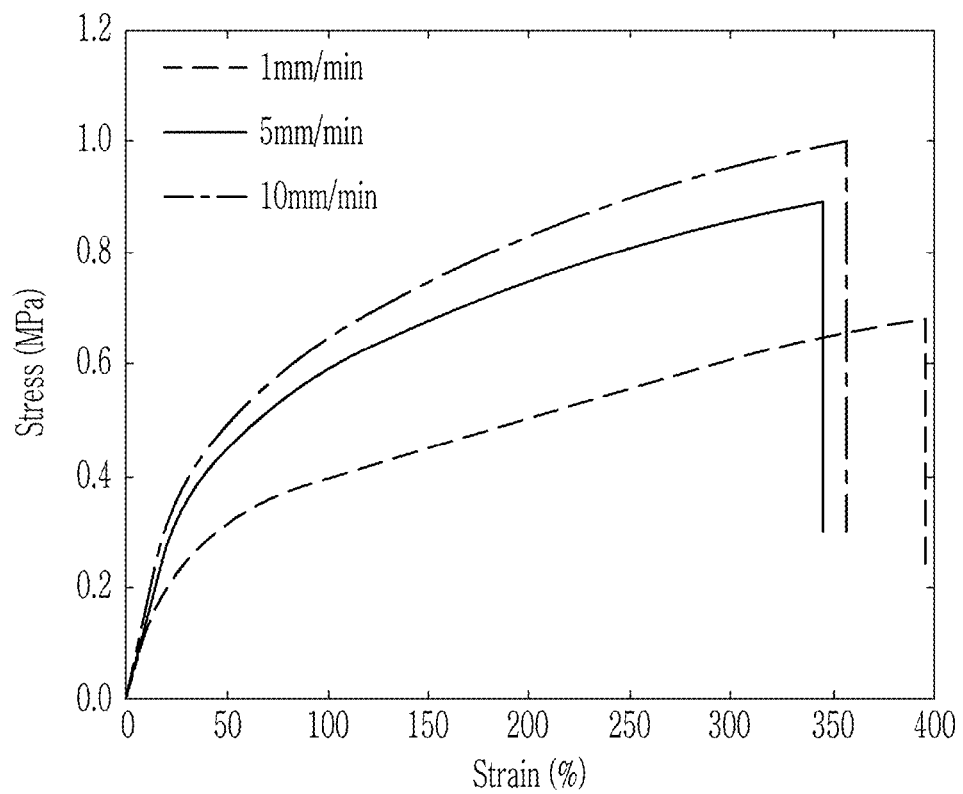

FIG. 14 is a graph showing cyclic stress-strain curves of the film samples, FIG. 15 is a graph showing stress extinction degrees of the film samples depending on a time, and FIGS. 16 to 18 are graphs showing stress-strain curves of the film samples depending on a displacement rate.

Referring to FIGS. 14 to 18, a hysteresis may have a different size depending on metal salt, and the film samples including a $Zn^{2+}$-containing coordination complex shows a larger hysteresis and a faster stress relaxation speed than those of the film samples including a $Fe^{2+}$-containing coordination complex. The reason is that a $Zn^{2+}$-bipyridine bond is dynamically more unstable than a $Fe^{2+}$-bipyridine bond, and $Zn^{2+}$ ions may adopt octahedron and tetrahedral geometry structures and thus reduce a stress concentration.

In addition, the stress relaxation speed may relate to counter ions of the metal salt and may be for example $Zn(OTf)_2$-PDMS>$Zn(ClO_4)_2$-PDMS>$ZnCl_2$-PDMS in order.

The film samples are completely cut with a razor blade in order to measure their self-healing. The surface of the cut film samples are compressed for several seconds and then, allowed to stand for 2 days at room temperature under ambient humidity until self-healed. As for the self-healed samples, a stress-strain test is performed at room temperature and at a speed of 5 mm/min. In the stress-strain test, self-healing efficiency may be defined as a ratio of a fracture stress of a self-healed sample relative to a fracture stress of a pristine sample.

Figure 19:
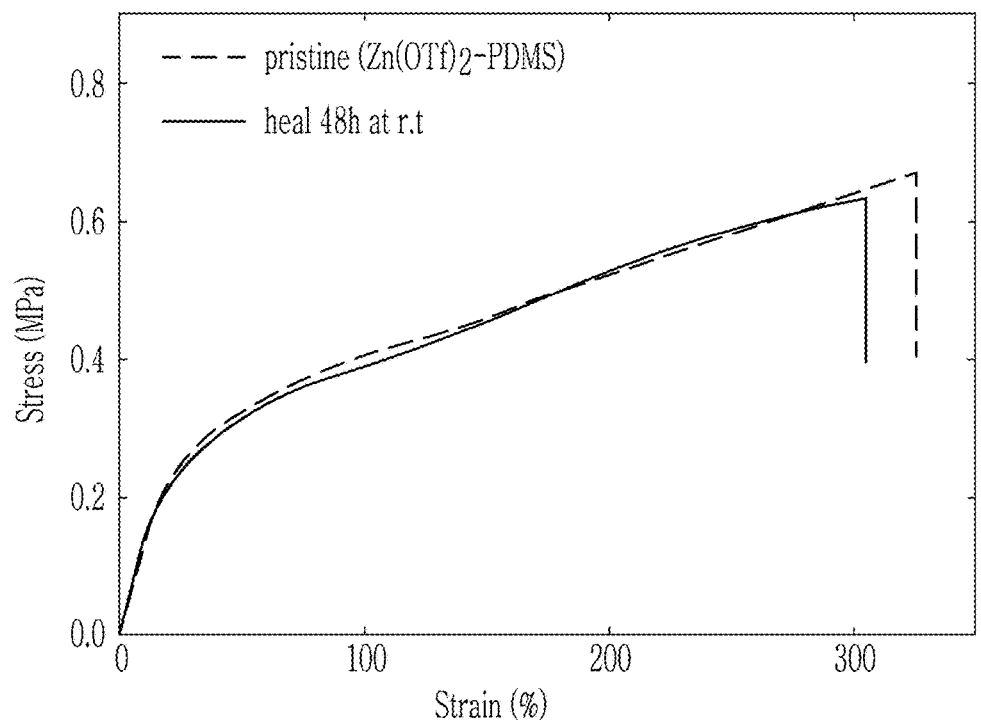
FIG. 19 is a graph showing strain and stress at break of a pristine sample film of $Zn(OTf)_2$-PDMS and its self-healed sample film.

FIG. 19 is a graph showing strain and stress at break of a pristine film sample of $Zn(OTf)_2$-PDMS and its self-healed film sample.

Referring to FIG. 19, the self-healing efficiency turns out to be about 76±22%.

Figure 20:
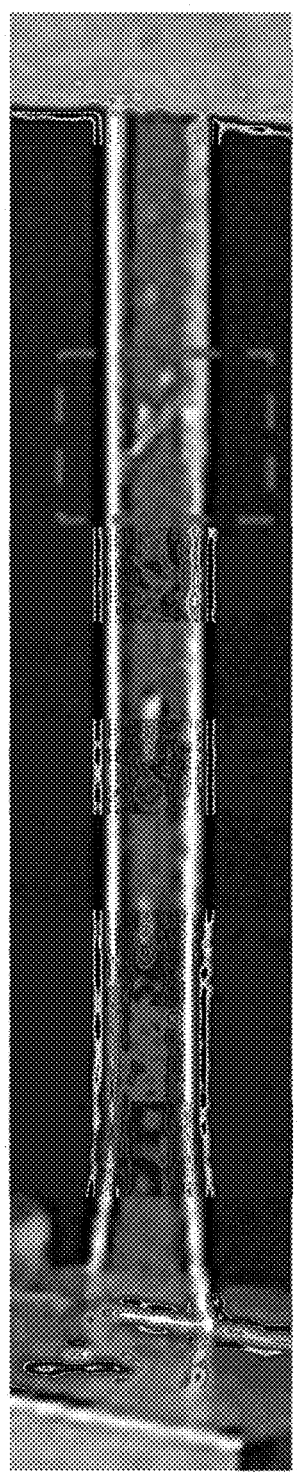
FIG. 20 is a photograph showing the self-healed film samples after cutting the film samples into two pieces.
Figure 21:
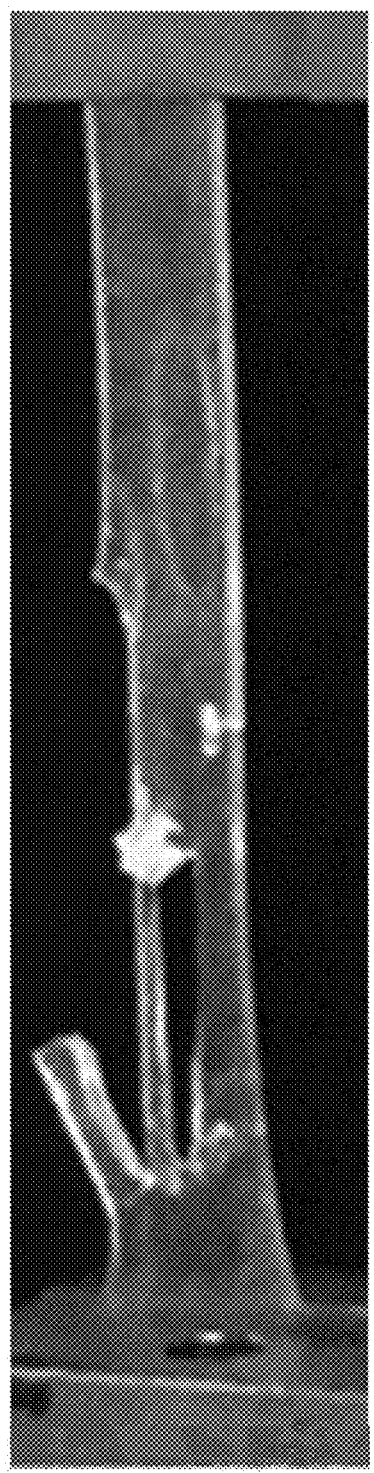
FIG. 21 is a photograph showing the self-healed film samples after cutting the film samples into two pieces under a tensile stress of greater than or equal to about 250%.

FIG. 20 is a photograph showing a sample film self-healed after cut into two pieces and FIG. 21 is a photograph showing a sample film self-healed after broken into two pieces under a tensile stress of greater than or equal to 250%.

Referring to FIGS. 20 and 21, the cut surface (a dotted line box) and broken surface of the sample films are effectively self-healed.

Manufacture of Device

Preparation of Gate Dielectric Material 100 mg (12.8 µM) of bpy-PDMS is fully dissolved in 3 ml octane and the solution is passed through a PFTE filter with membrane pore size of 1 µm. A 50 µL aliquot of a methanol solution containing 4.3 µM metal salt ($FeCl_2$, $Fe(BF_4)_2$, $ZnCl_2$, $Zn(ClO_4)_2$, and $Zn(OTf)_2$) is subsequently added to the solution at a room temperature. Due to the immiscibility of methanol and octane, the solution becomes cloudy initially. After being vigorously stirred overnight, a clear gate dielectric material solution having increased viscosity is obtained.

Manufacture of MIM Capacitor

Highly n-doped Si (100) wafer is used as substrates and bottom electrodes. Subsequently, the gate dielectric material solution is spin-coated on the Si (100) wafer to form a dielectric layer. Then, 5 nm Al adhesion layer and 40 nm top gold electrodes with an area of 12.25 mm² are sequentially deposited by evaporation through a shadow mask.

Evaluation 4: Electrical Characteristics I

Figure 22:
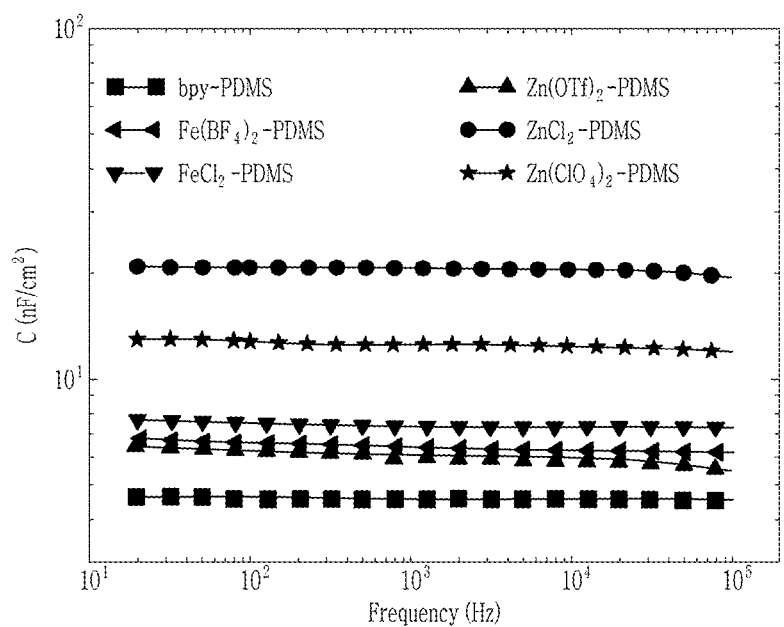
FIG. 22 is a graph showing capacitance of a MIM capacitor depending on a frequency.

FIG. 22 is a graph showing capacitance of a MIM capacitor depending on a frequency.

Herein, bpy-PDMS: 550 nm; $Fe(BF_4)_2$-PDMS: 490 nm; $FeCl_2$-PDMS: 386 nm; $Zn(OTf)_2$-PDMS: 470 nm; $ZnCl_2$-PDMS: 138 nm; $Zn(ClO_4)_2$-PDMS: 238 nm.

Referring to FIG. 22, the MIM capacitor has stability in a wide range of 20 Hz to $10^5$ Hz. Based on the result, an ionic effect is very low in a dielectric layer, and the low ionic effect is related to a stable coordination between a non-polar elastic polymer and a bipyridine moiety and metal ions.

A dielectric constant of the MIM capacitor is shown in Table 1.

TABLE 1

| Polymer | E (MPa)[a] | ε (%)[b] | $\varepsilon_r$[c] |
|---|---|---|---|
| bpy-PDMS | 1.0 ± 0.1 | 87 ± 15 | 2.9 |
| $FeCl_2$-PDMS | 0.9 ± 0.2 | 125 ± 20 | 3.5 |
| $Fe(BF_4)_2$-PDMS | 1.0 ± 0.15 | 110 ± 16 | 3.6 |
| $ZnCl_2$-PDMS | 1.2 ± 0.21 | 143 ± 20 | 3.3 |
| $Zn(ClO_4)_2$-PDMS | 1.2 ± 0.15 | 295 ± 17 | 3.5 |
| $Zn(OTf)_2$-PDMS | 1.1 ± 0.2 | 310 ± 15 | 3.5 |

[a]Young's modulus, calculated from the initial slope of stress-strain curves (within 10% strain).
[b]ultimate tensile strain (displacement rate: 5 mm/min).
[c]dielectric constant.

Referring to Table 1, a coordination complex metal ion coordinated with metal ions shows an effectively increased dielectric constant compared with a polymer not coordinated with the metal ions and accordingly, may effectively decrease an operating voltage of a thin film transistor.

Manufacture of Thin Film Transistor (on Rigid Substrate) I

A thin film transistor having a bottom contact/top gate structure is manufactured. Highly n-doped Si (100) wafer with 300 nm thermally grown $SiO_2$ is used as a substrate. 45 nm bottom contact gold electrodes are deposited by evaporation through a shadow mask on the Si (100) wafer. Herein the channel length is 4000 µm and the channel width is 50 µm, 100 µm and 200 µm. Subsequently, each polymer semiconductor solution (P1, P2, N1 5 mg/ml in chlorobenzene; P3 5 mg/ml in p-xylene) is spin-coated on the substrate at a spin rate of 1000 rpm for 60 seconds to form organic semiconductors. Then films are thermally annealed at 170° C. for 1 hour inside a $N_2$-filled glovebox.

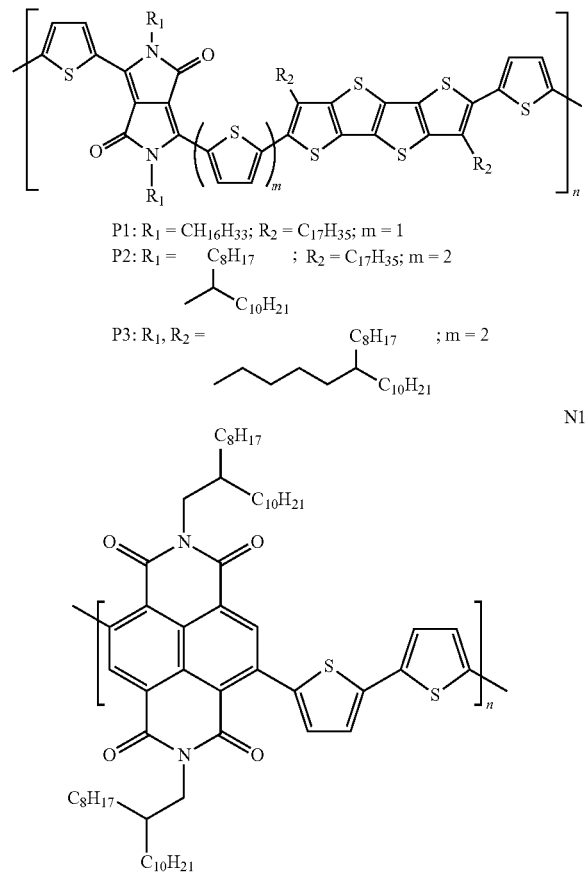

P1: $R_1 = CH_{16}H_{33}$; $R_2 = C_{17}H_{35}$; m = 1
P2: $R_1 = $ [structure with $C_8H_{17}$ and $C_{10}H_{21}$]; $R_2 = C_{17}H_{35}$; m = 2
P3: $R_1, R_2 = $ [structure with $C_8H_{17}$ and $C_{10}H_{21}$]; m = 2

N1

Subsequently, the gate dielectric material solution is spin-coated on the organic semiconductor at 500 rpm for 60 seconds and then spin-coated at 2000 rpm for 30 seconds to form a gate dielectric layer. The thicknesses of the obtained gate dielectric layers are around 1.4 μm for $FeCl_2$-PDMS; around 1.35 μm for $Fe(BF_4)_2$-PDMS; around 1.2 μm for $ZnCl_2$-PDMS; around 1.4 μm for $Zn(ClO_4)_2$-PDMS; and around 1.5 μm for $Zn(OTf)_2$-PDMS, respectively.

To reduce gate leakage current, a thicker dielectric layer could be obtained by further spin-coating another one or two layers at 2000 rpm for 60 seconds. With two-layer spin coating, thicknesses of the gate dielectric layer are as follows: around 3.5 μm for $FeCl_2$-PDMS; around 4 μm for $Fe(BF_4)_2$-PDMS; around 3 μm for $ZnCl_2$-PDMS; around 3 μm for $Zn(ClO_4)_2$-PDMS; and around 3 μm for $Zn(OTf)_2$-PDMS, and with three-layer spin coating, thicknesses of the gate dielectric layer are around 5.5 μm for $FeCl_2$-PDMS; around 6 μm for $Fe(BF_4)_2$-PDMS; and around 5 μm for $ZnCl_2$-PDMS. To complete the device, eutectic gallium indium (EGaIn) liquid metal was applied as a top gate using a syringe and needle to manufacture thin film transistors.

Evaluation 5: Electrical Characteristics II

The thin film transistor is used to evaluate an effect as a gate dielectric layer in a thin film transistor.

A mobile ion effect in the gate dielectric layer is examined through hysteresis from cyclic transfer characteristics ($I_D$ vs $V_G$).

Figure 23:
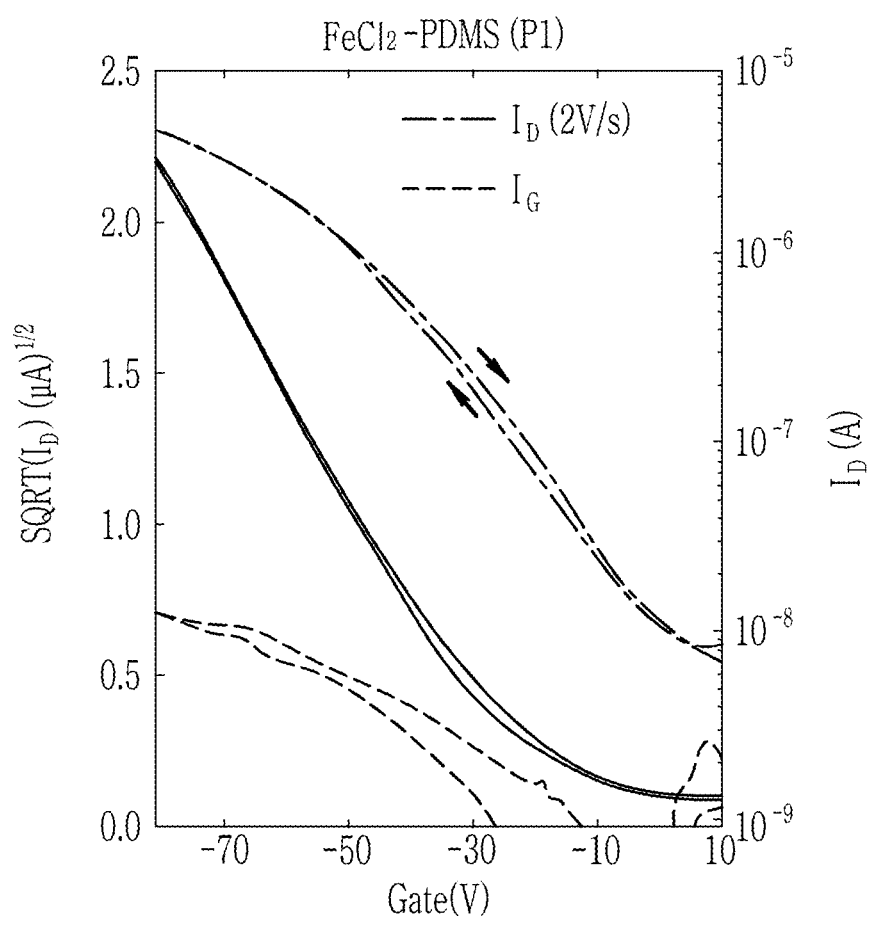
FIG. 23 is a graph showing a cyclic transfer curve of a thin film transistor manufactured by applying a gate dielectric layer including a $FeCl_2$-PDMS coordination complex (C: 0.56 nF/cm², channel length: 50 μm) and a P1 organic semiconductor.
Figure 24:
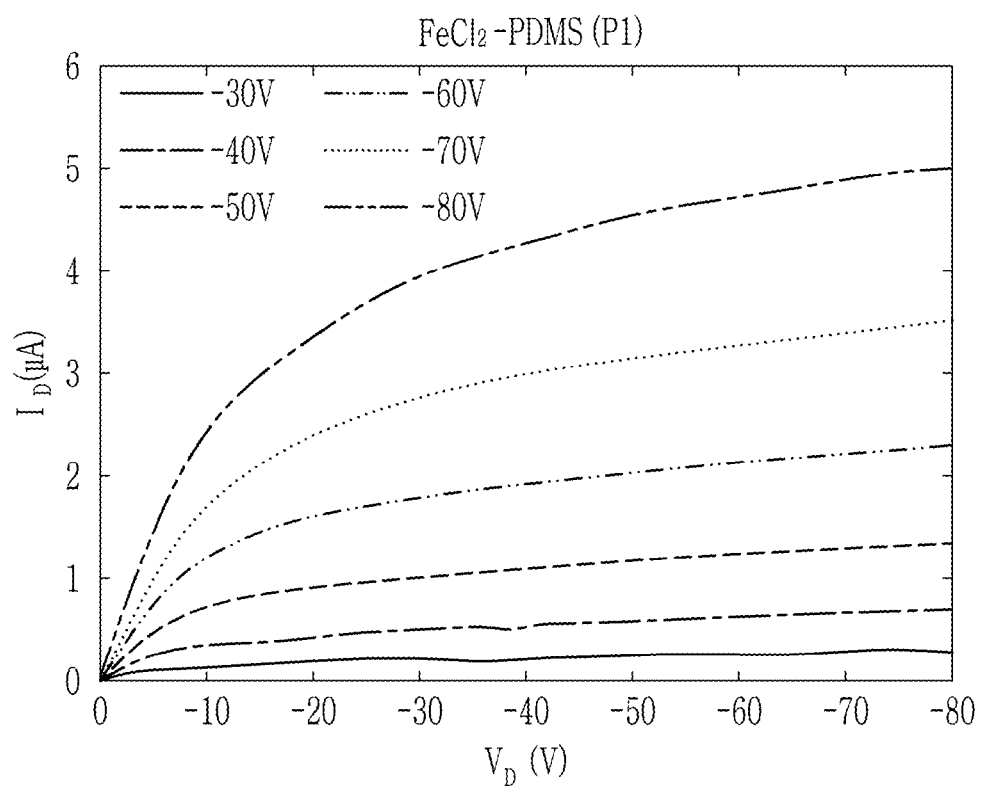
FIG. 24 is a graph showing an output curve of the thin film transistor manufactured by applying a gate dielectric layer including a $FeCl_2$-PDMS coordination complex and a P1 organic semiconductor.

FIG. 23 is a graph showing a cyclic transfer curve of a thin film transistor manufactured by applying a gate dielectric layer including a $FeCl_2$-PDMS coordination complex (C: 0.56 $nF/cm^2$, channel length: 50 μm) and a P1 organic semiconductor and FIG. 24 is a graph showing an output curve of the thin film transistor manufactured by applying a gate dielectric layer including a $FeCl_2$-PDMS coordination complex and a P1 organic semiconductor.

Figure 25:
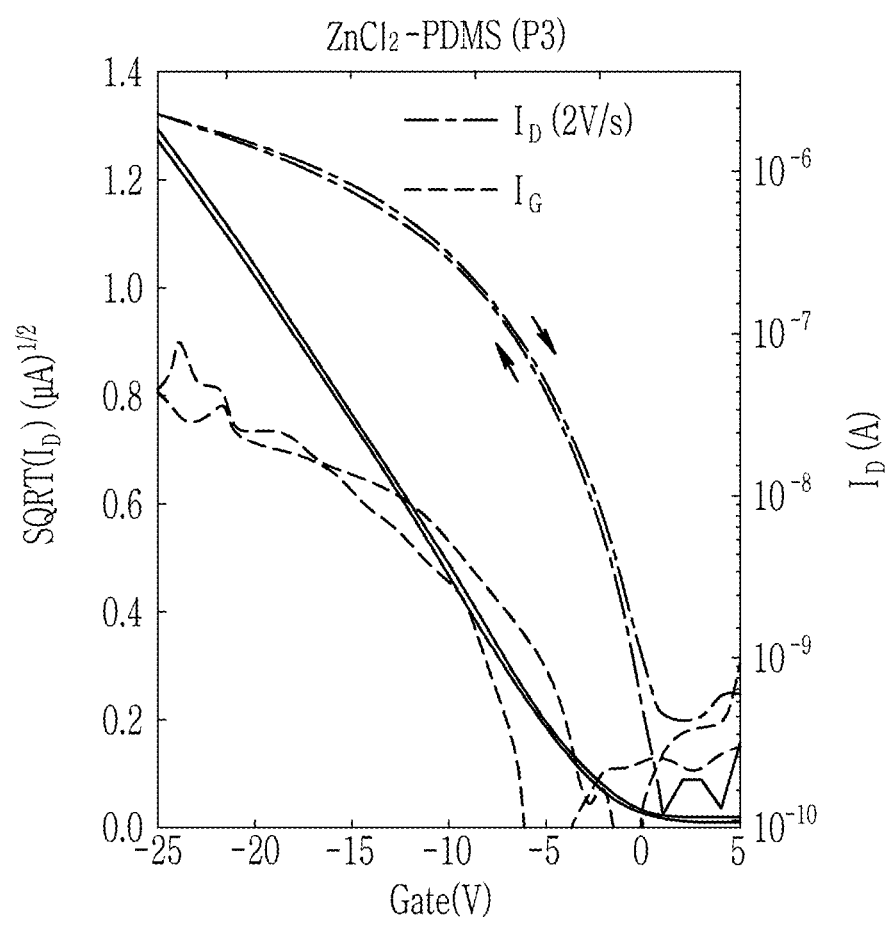
FIG. 25 is a graph showing a cyclic transfer curve of a thin film transistor manufactured by applying a gate dielectric layer including a $ZnCl_2$-PDMS coordination complex (C: 2.4 nF/cm², channel length: 100 μm) and a P3 organic semiconductor.
Figure 26:
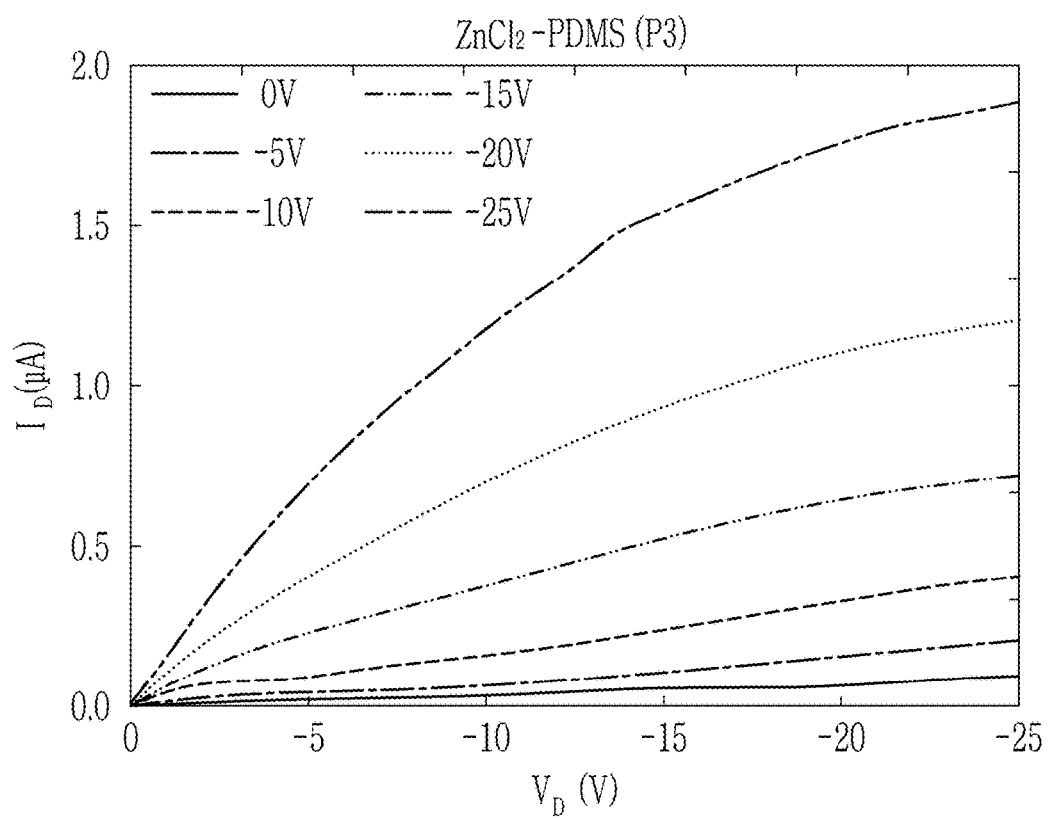
FIG. 26 is a graph showing an output curve of the thin film transistor manufactured by applying a gate dielectric layer including a $ZnCl_2$-PDMS coordination complex and a P3 organic semiconductor.

FIG. 25 is a graph showing a cyclic transfer curve of a thin film transistor manufactured by applying a gate dielectric layer including a $ZnCl_2$-PDMS coordination complex (C: 2.4 $nF/cm^2$, channel length: 100 μm) and a P3 organic semiconductor and FIG. 26 is a graph showing an output curve of the thin film transistor manufactured by applying a gate dielectric layer including a $ZnCl_2$-PDMS coordination complex and a P3 organic semiconductor.

Figure 27:
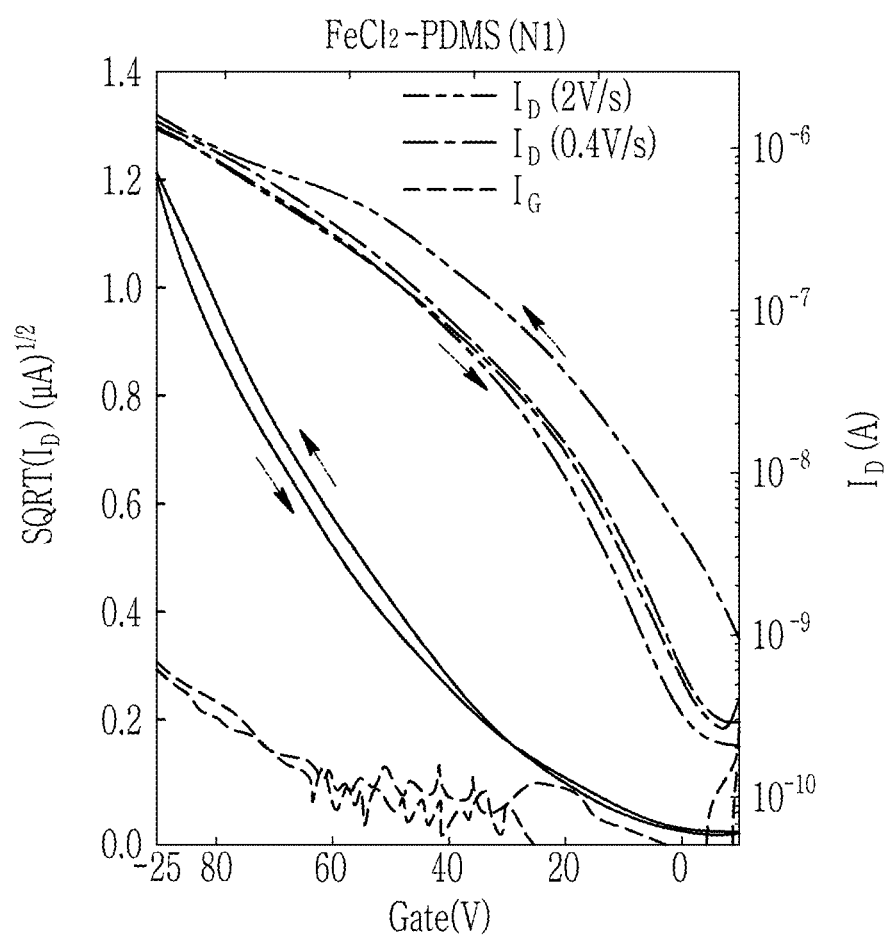
FIG. 27 is a graph showing a cyclic transfer curve of a thin film transistor manufactured by applying a gate dielectric layer including a FeCl$_2$-PDMS coordination complex (C: 0.53 nF/cm$^2$, channel length: 50 μm) and an N1 organic semiconductor.
Figure 28:
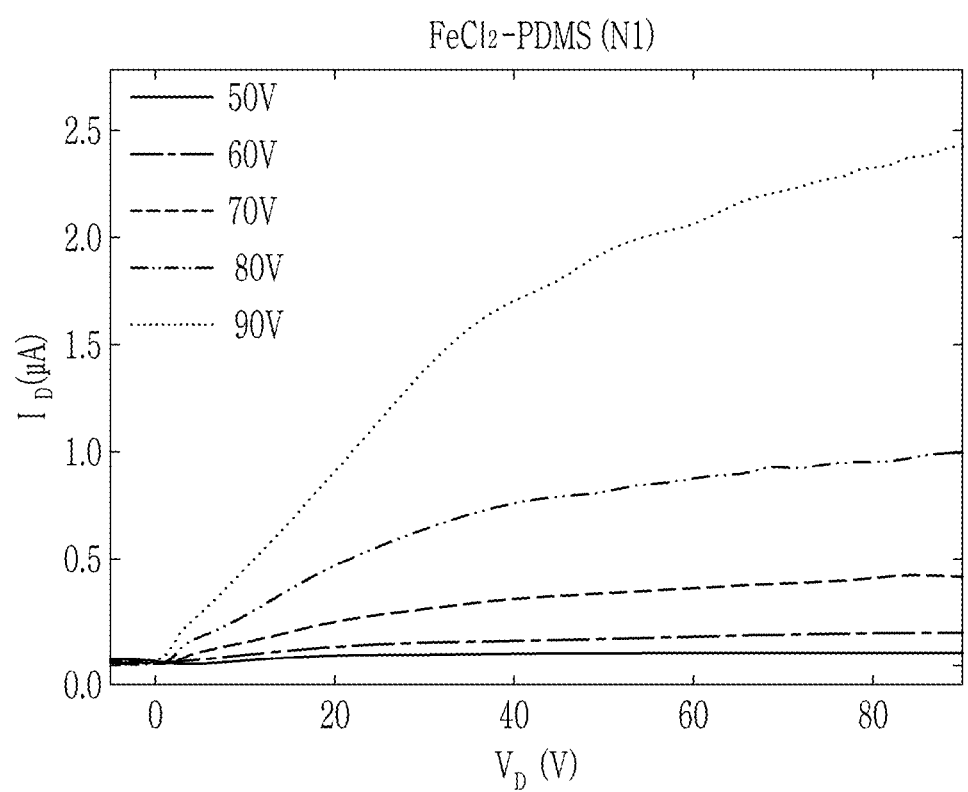
FIG. 28 is a graph showing an output curve of the thin film transistor manufactured by applying a gate dielectric layer including a FeCl$_2$-PDMS coordination complex and an N1 organic semiconductor.

FIG. 27 is a graph showing a cyclic transfer curve of a thin film transistor manufactured by applying a gate dielectric layer including a $FeCl_2$-PDMS coordination complex (C: 0.56 $nF/cm^2$, channel length: 50 μm) and an N1 organic semiconductor and FIG. 28 is a graph showing an output curve of the thin film transistor manufactured by applying a gate dielectric layer including a $FeCl_2$-PDMS coordination complex and an N1 organic semiconductor.

Referring to FIGS. 23 to 28, the thin film transistor of Example shows almost hysteresis-free transportation characteristics and satisfactory output characteristics.

Table 2 shows electrical characteristics of the thin film transistors.

The electrical characteristics are evaluated about P1, P2, and P3 under an air atmosphere and about N1 under a nitrogen atmosphere by using Keithley4200.

TABLE 2

| | $FeCl_2$-PDMS | | | | | $ZnCl_2$-PDMS | | | | |
|---|---|---|---|---|---|---|---|---|---|---|
| OSC | $d^1$ (μm) | $C^2$ (nF/cm²) | μ (cm²/V · s) | $V_{th}$ | on/off | d (μm) | C (nF/cm²) | μ (cm²/V · s) | $V_{th}$ | on/off |
| P1 | 3.5 | 0.88 | 0.19 ± 0.03 | −15 ± 2 | 5.9 × 10³ | 5 | 0.58 | 0.17 ± 0.03 | −21 ± 4 | 3.2 × 10³ |
| | 5.5 | 0.56 | 0.16 ± 0.02 | −18 ± 4 | 2.1 × 10³ | | | | | |
| P2 | 3.5 | 0.88 | 0.18 ± 0.02 | 7 ± 3 | 4.4 × 10³ | 3 | 0.07 | 0.2 ± 0.02 | 1.1 ± 0.6 | 2.1 × 10³ |
| P3 | 3.5 | 0.88 | 0.35 ± 0.1 | 2.5 ± 5 | 1.3 × 10³ | 1.2 | 2.4 | 0.29 ± 0.06 | −2 ± 2 | 1.2 × 10⁴ |
| N1 | 3.5 | 0.56 | 0.11 ± 0.04 | 27 ± 16 | 5.3 × 10³ | 1.2 | 2.4 | 0.14 ± 0.03 | 1.2 ± 5 | 2.7 × 10³ |

[1]Dielectric thickness
[2]The dielectric capacitance value.

Manufacture of Thin Film Transistor (on Stretchable Substrate) II

A thin film transistor having a bottom contact/top gate structure is manufactured. Solutions for carbon nanotubes (CNTs) electrodes are prepared by dispersion of 10 mg of CNTs (Carbon Solutions, AP-SWNTs) and 5 mg of poly(3-hexylthiophene) (P3HT) in 60 ml CHCl$_3$, using a tip horn sonicator, and the solution is spray-coated using a commercial airbrush (Master Airbrush, Model SB844-SET) onto an OTMS-treated Si wafer. Electrodes are patterned by evaporating 100 nm of copper followed by etching the CNTs using O$_2$ plasma. The copper is subsequently removed using a commercial copper etchant (ferric chloride, MG Chemicals). The CNT gate electrodes are then transferred onto a SEBS substrate (styrene-ethylene-butylene-styrene substrate) (AKelastic polymer, H1062) with a light pressure at 60° C. Polymer semiconductors P2 and P3 are spin-coated onto an OTMS wafer, then transferred onto the SEBS with source/drain electrodes. Then the gate dielectric material solutions are spin-coated on the OTMS wafer and then transferred onto the substrate subsequently. To complete the device, eutectic gallium indium (EGaIn) liquid metal is applied as a top gate using a syringe and needle to manufacture a stretchable thin film transistor.

Evaluation 6: Electrical Characteristics III

Figure 29:
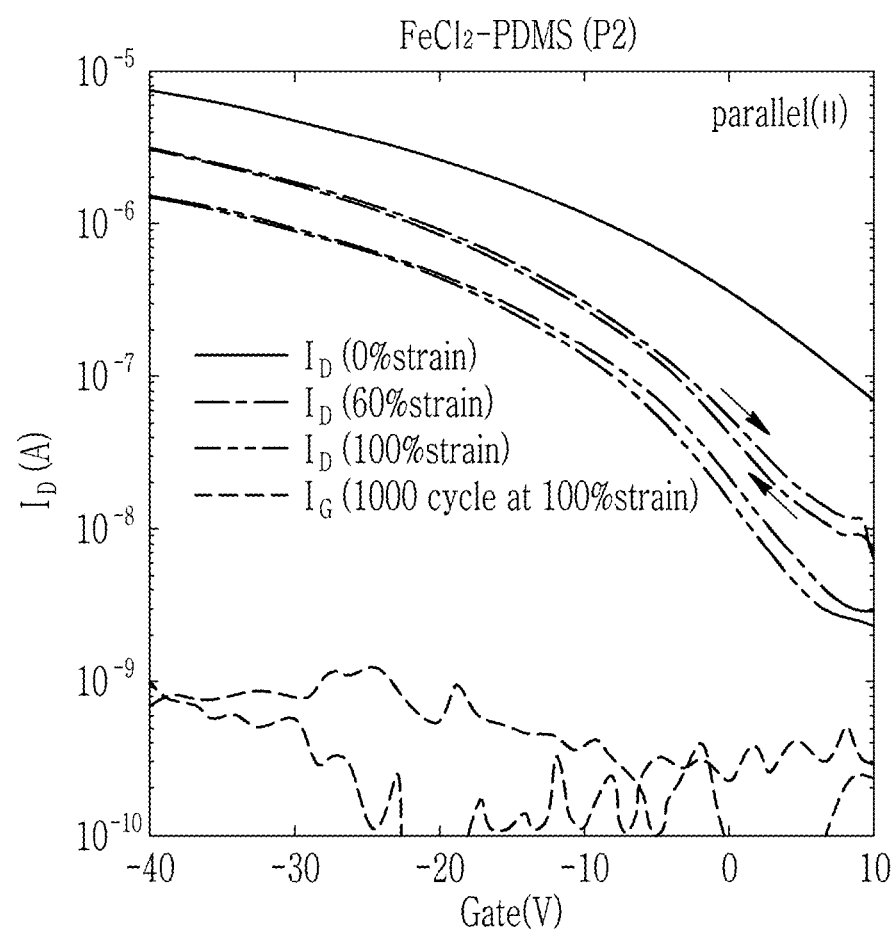
FIG. 29 is a graph showing a transfer curve of a thin film transistor manufactured by applying a gate dielectric layer including a FeCl$_2$-PDMS coordination complex (C: 0.85 nF/cm$^2$, channel width: 4000 μm, channel length: 50 μm) and a P2 organic semiconductor after stretched in a parallel direction to a channel.
Figure 30:
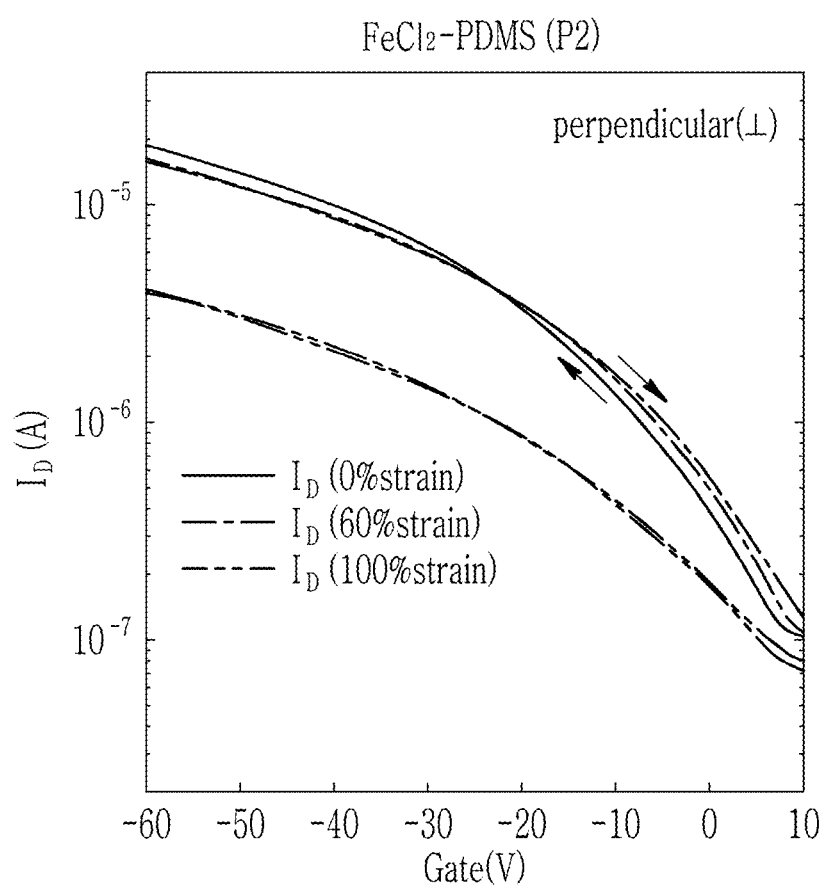
FIG. 30 is a graph showing a transfer curve of the thin film transistor manufactured by applying a gate dielectric layer including a FeCl$_2$-PDMS coordination complex (C: 0.85 nF/cm$^2$, channel width: 4000 μm, channel length: 50 μm) and a P2 organic semiconductor after stretched in a vertical direction with the channel.
Figure 31:
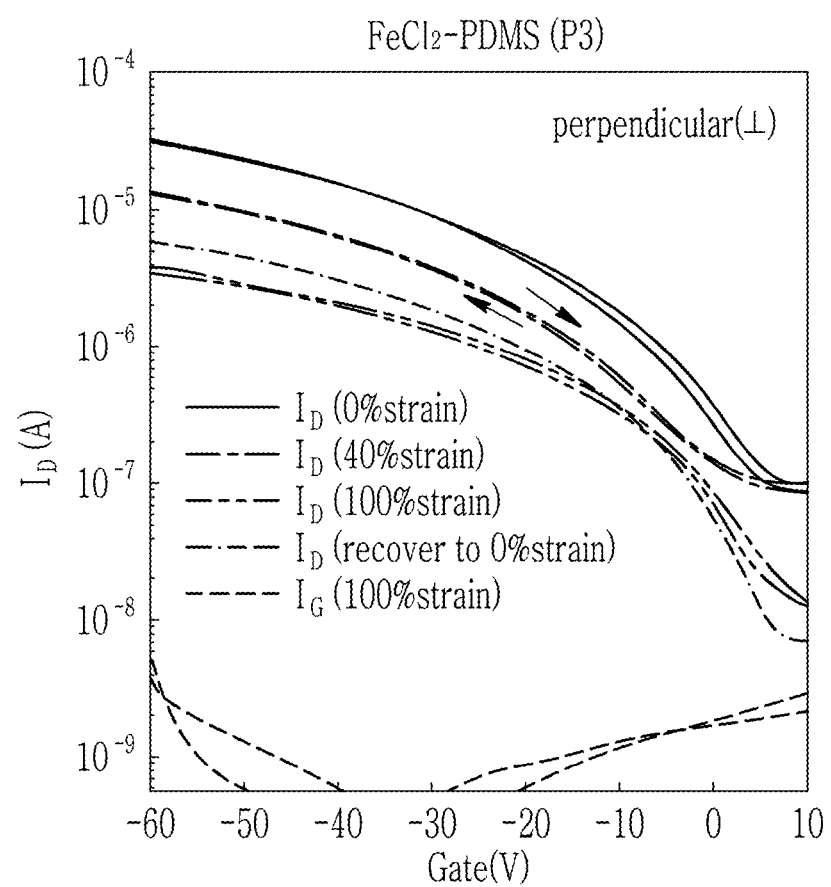
FIG. 31 is a graph showing a transfer curve of the thin film transistor manufactured by applying a gate dielectric layer including a FeCl$_2$-PDMS coordination complex (C: 0.85 nF/cm$^2$, channel width: 4000 μm, channel length: 50 μm) and a P3 organic semiconductor after stretched in a parallel direction to the channel.

FIG. 29 is a graph showing a transfer curve of the thin film transistor manufactured by applying a gate dielectric layer including a FeCl$_2$-PDMS coordination complex (C: 0.85 nF/cm$^2$, channel width: 4000 μm, channel length: 50 μm) and a P2 organic semiconductor after stretched in a parallel direction to a channel, FIG. 30 is a graph showing the transfer curve of the thin film transistor manufactured by applying a gate dielectric layer including a FeCl$_2$-PDMS coordination complex (C: 0.85 nF/cm$^2$, channel width: 4000 μm, channel length: 50 μm) and a P2 organic semiconductor after stretched in a vertical direction to the channel, and FIG. 31 is a graph showing the transfer curve of a thin film transistor manufactured by applying a gate dielectric layer including a FeCl$_2$-PDMS coordination complex (C: 0.85 nF/cm$^2$, channel width: 4000 μm, channel length: 50 μm) and a P3 organic semiconductor after stretched in a parallel direction to a channel.

Referring to FIGS. 29 to 31, the stretched thin film transistors show almost hysteresis-free transportation characteristics. Particularly, referring to FIG. 29, the thin film transistors maintain a gate leakage current of less than or equal to about 1 nA after 1000 times repetitive elongations and contractions under a strain of 100%, and accordingly, mechanical robustness of gate dielectric layers is confirmed.

While some example embodiments have been described, the present disclosure should be considered in a descriptive sense, not for purposes of limitation. Features and/or aspects within each device or method according to example embodiments generally should be considered as available for other similar features or aspects in other devices according to example embodiments. It is to be understood that variations in form and details may be made without departing from the spirit and scope of the claims.

What is claimed is:

1. A polymeric dielectric comprising:
a coordination complex of a modified elastic polymer and a metal cation,
the modified elastic polymer including an organic ligand moiety that coordinates the metal cation in a main chain of an elastic polymer.

2. The polymeric dielectric of claim 1, wherein the organic ligand moiety includes a heterocycle having at least one nitrogen.

3. The polymeric dielectric of claim 2, wherein the organic ligand moiety includes one of a pyridine moiety, a bipyridine moiety, a terpyridine moiety, a pyrimidine moiety, a bipyrimidine moiety, a terpyrimidine moiety, a phenanthroline moiety, or a combination thereof.

4. The polymeric dielectric of claim 2, wherein the organic ligand moiety further includes an acyl amide bound to the heterocycle.

5. The polymeric dielectric of claim 2, wherein the organic ligand moiety includes 2,2'-bipyridine-5,5'-dicarboxylic amide.

6. The polymeric dielectric of claim 2, wherein the metal cation is coordinated with a nitrogen atom of the organic ligand moiety.

7. The polymeric dielectric of claim 1, wherein the elastic polymer is a non-polar elastic polymer.

8. The polymeric dielectric of claim 1, wherein the elastic polymer includes one of polyurethane, polysiloxane, polydimethylsiloxane, polybutadiene, a styrene-butadiene copolymer, a styrene-butadiene-styrene copolymer, a styrene-ethylene-butylene-styrene copolymer, an ethylene propylene diene rubber, an acrylic rubber, a polychloroprene rubber, a silicone rubber, or a combination thereof.

9. The polymeric dielectric of claim 1, wherein
the elastic polymer is polysiloxane having a siloxane repeating unit or polydimethylsiloxane having a dimethylsiloxane repeating unit, and
the organic ligand moiety is linked with terminal ends of 10 to 200 siloxane repeating units or dimethylsiloxane repeating units.

10. The polymeric dielectric of claim 1, wherein
the elastic polymer is polysiloxane having a siloxane repeating unit or polydimethylsiloxane having a dimethylsiloxane repeating unit and
the elastic polymer includes 20 to 200 repeating units including the organic ligand moiety and the siloxane repeating unit or the organic ligand and the dimethylsiloxane repeating unit.

11. The polymeric dielectric of claim 1, wherein the organic ligand moiety is included in an amount of about 0.01 mmol to about 10 mmol relative to 1 g of the elastic polymer.

12. The polymeric dielectric of claim 1, wherein the modified elastic polymer is represented by Chemical Formula 1:

[Chemical Formula 1]

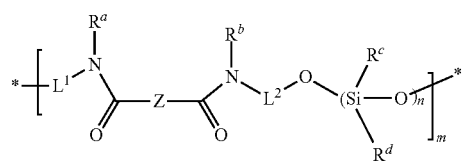

wherein, in Chemical Formula 1,
Z is a divalent heterocyclic group having at least one nitrogen,
$L^1$ and $L^2$ are independently a substituted C1 to C10 alkyl group or unsubstituted C1 to C10 alkyl group,
$R^a$ and $R^b$ are independently hydrogen, a substituted C1 to C10 alkyl group, or an unsubstituted C1 to C10 alkyl group,
$R^c$ and $R^d$ are independently hydrogen or a methyl group,
n is 10 to 200, and
m is 20 to 200.

13. The polymeric dielectric of claim 1, wherein the metal cation is a multivalent metal cation.

14. The polymeric dielectric of claim 1, wherein the metal cation is one of $Zn^{2+}$, $Fe^{2+}$, $Cu^{2+}$, $Ni^{2+}$, $Co^{2+}$, $Ru^{2+}$, $Zn^{3+}$ $Fe^{3+}$, $Ln^{3+}$, or a combination thereof.

15. The polymeric dielectric of claim 1, further comprising:
a counter anion disposed adjacent to the metal cation.

16. The polymeric dielectric of claim 15, wherein the counter anion includes one of a chloride (Cl—), a tetrafluoroborate ($BF_4$—), perchlorate ($ClO_4$—), a trifluoromethanesulfonate ($CF_3SO_3$—), a hexafluorophosphate ($PF_6$—), a nitrate, an acetate, a phosphate, or a combination thereof.

17. The polymeric dielectric of claim 1, wherein the polymeric dielectric has a dielectric constant of about 3.0 to about 3.6.

18. The polymeric dielectric of claim 1, wherein the polymeric dielectric has a tensile strength of about 100% to about 400%.

19. An electronic device comprising:
the polymeric dielectric of claim 1.

20. A thin film transistor comprising
a gate electrode,
a semiconductor overlapping the gate electrode,
a gate dielectric layer between the gate electrode and the semiconductor, the gate dielectric layer including the polymeric dielectric of claim 1, and
a source electrode and a drain electrode electrically connected to the semiconductor.

21. A composition comprising:
a modified elastic polymer including an organic ligand moiety in a main chain of an elastic polymer; and
a metal salt compound.

22. The composition of claim 21, wherein the metal salt compound is included in an amount of about 0.1 mol to about 1 mol relative to 1 mol of the organic ligand moiety.

23. The composition of claim 21, wherein the modified elastic polymer and the metal salt compound are included in a mole ratio of about 1:5 to about 5:1.

24. The composition of claim 21, wherein the elastic polymer includes one of polyurethane, polysiloxane, polydimethylsiloxane, polybutadiene, a styrene-butadiene copolymer, a styrene-butadiene-styrene copolymer, a styrene-ethylene-butylene-styrene copolymer, an ethylene propylene diene rubber, an acrylic rubber, a polychloroprene rubber, a silicone rubber, or a combination thereof, and
the organic ligand moiety includes one of a pyridine moiety, a bipyridine moiety, a terpyridine moiety, a pyrimidine moiety, a bipyrimidine moiety, a terpyrimidine moiety, a phenanthroline moiety, or a combination thereof.

25. The composition of claim 21, wherein the metal salt compound includes one of $FeCl_2$, $ZnCl_2$, $Fe(BF_4)_2$, $Zn(BF_4)_2$, $Fe(CF_3SO_3)_2$, $Zn(CF_3SO_3)_2$, $Fe(ClO_4)_2$, $Zn(ClO_4)2$, or a combination thereof.

26. The composition of claim 21, wherein the composition is gelated.

27. A method of manufacturing the polymeric dielectric of claim 1, the method comprising:
preparing the modified elastic polymer;
preparing a composition including the modified elastic polymer, a metal salt compound, and a solvent;
coating the composition on a substrate; and
drying the composition.

28. The method of claim 27, wherein
the preparing the modified elastic polymer includes reacting an elastic polymer precursor with a nitrogen-containing heterocyclic compound,
the elastic polymer precursor includes an amine group at a terminal end of the elastic polymer precursor, and
the nitrogen-containing heterocyclic compound includes an acyl chloride at a terminal end of the nitrogen-containing heterocylic compound.

29. The method of claim 28, wherein
the elastic polymer precursor includes bis-amine terminated polydimethylsiluxane, and
the nitrogen-containing heterocyclic compound includes 2,2'-bipyridine 5,5'-dicarboxylic acid chloride.

* * * * *